United States Patent
Hiroki

(10) Patent No.: US 10,312,062 B2
(45) Date of Patent: Jun. 4, 2019

(54) TEMPERATURE CONTROL SYSTEM AND TEMPERATURE CONTROL METHOD

(71) Applicant: TOKYO ELECTRON LIMITED, Tokyo (JP)

(72) Inventor: Tsutomu Hiroki, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 747 days.

(21) Appl. No.: 14/879,438

(22) Filed: Oct. 9, 2015

(65) Prior Publication Data

US 2016/0104605 A1    Apr. 14, 2016

(30) Foreign Application Priority Data

Oct. 14, 2014    (JP) ................................. 2014-209699

(51) Int. Cl.
*H01L 21/67*    (2006.01)
*H01J 37/32*    (2006.01)

(52) U.S. Cl.
CPC .. *H01J 37/32798* (2013.01); *H01J 37/32532* (2013.01); *H01L 21/67109* (2013.01); *H01L 21/67248* (2013.01)

(58) Field of Classification Search
CPC ......... H01L 21/67103; H01L 21/67109; H01L 21/67248; H01L 21/6831
See application file for complete search history.

(56) References Cited

U.S. PATENT DOCUMENTS

| | | | | |
|---|---|---|---|---|
| 2005/0133157 A1* | 6/2005 | Choi | ................. | H01L 21/67109 156/345.27 |
| 2009/0118872 A1* | 5/2009 | Nonaka | .............. | G05D 23/1934 700/285 |
| 2012/0132397 A1* | 5/2012 | Silveira | ................... | H01J 37/20 165/104.13 |

FOREIGN PATENT DOCUMENTS

| | | |
|---|---|---|
| JP | 10-296075 A | 11/1998 |
| JP | 2014-21828 A | 2/2014 |

* cited by examiner

*Primary Examiner* — Eric S Ruppert
(74) *Attorney, Agent, or Firm* — Nath, Goldberg & Meyer; Jerald L. Meyer

(57) ABSTRACT

There is provided a temperature control system, including: a stage configured to support a workpiece and provided with a heat exchange medium flow path formed within the stage, the heat exchange medium flow path including a first end and a second end; a first valve; a second valve; a first heat exchange medium supply device including a supply port which supplies a first heat exchange medium adjusted to have a first temperature and a recovery port; a second heat exchange medium supply device including a supply port which supplies a second heat exchange medium adjusted to have a second temperature higher than the first temperature and a recovery port; and a control device configured to control the first and second valves such that the first and second heat exchange mediums are alternately supplied to the first end of the heat exchange medium flow path.

7 Claims, 16 Drawing Sheets

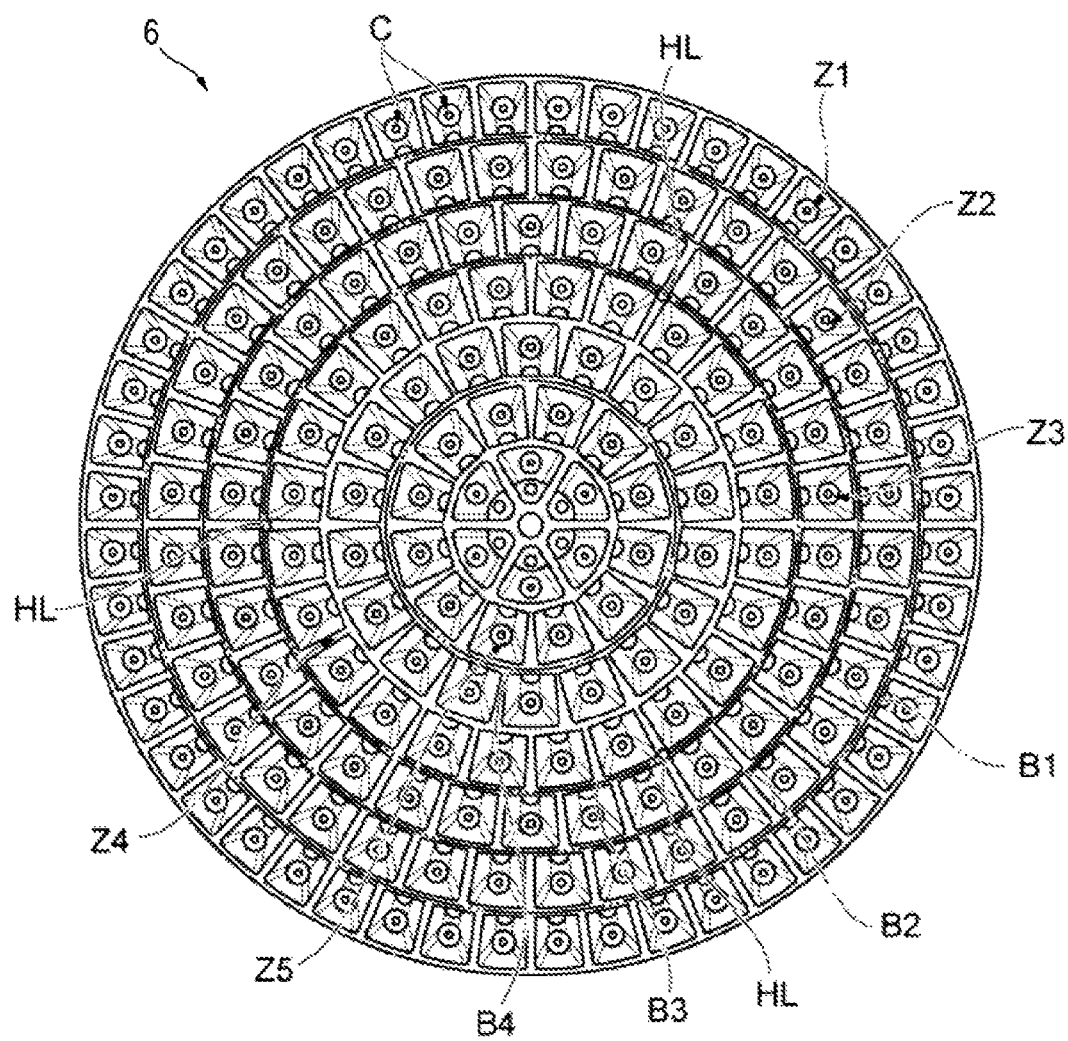

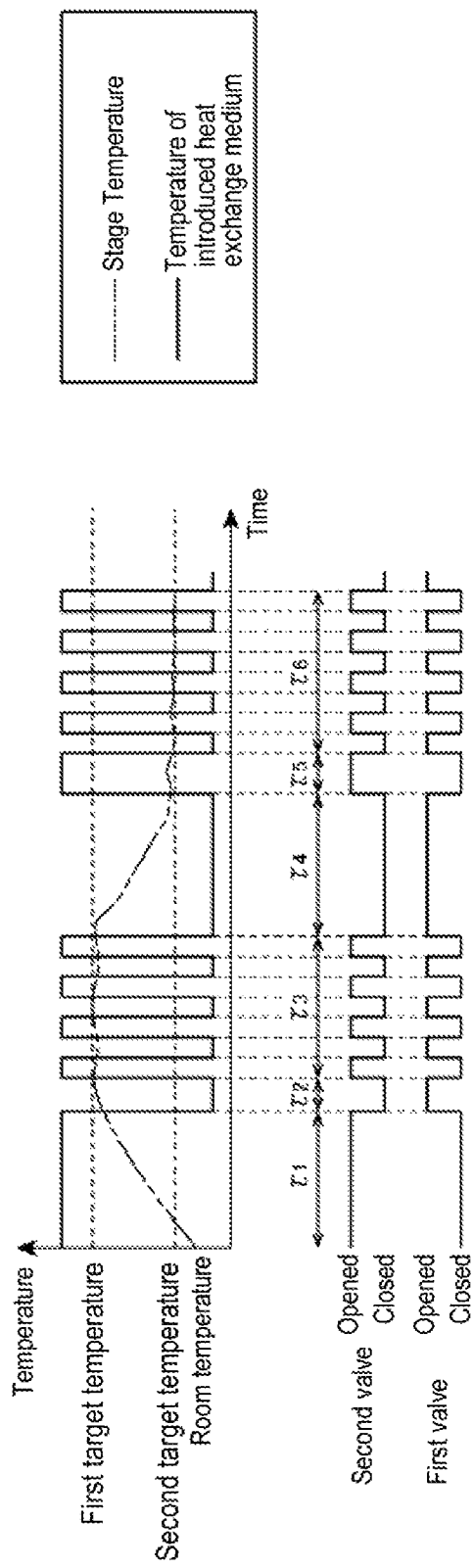

TEMPERATURE CONTROL SYSTEM AND TEMPERATURE CONTROL METHOD

CROSS-REFERENCE TO RELATED APPLICATION

This application claims the benefit of Japanese Patent Application No. 2014-209699, filed on Oct. 14, 2014, in the Japan Patent Office, the disclosure of which is incorporated herein in its entirety by reference.

TECHNICAL FIELD

The present disclosure relates to a temperature control system and a temperature control method.

BACKGROUND

When manufacturing an electronic device, a plasma processing such as a plasma etching, a plasma CVD or the like is performed with respect to a workpiece. There is known a plasma processing apparatus for implementing such a plasma processing.

Such a plasma processing apparatus includes a processing vessel, a stage for supporting a workpiece within the processing vessel, and a temperature control system for controlling a temperature of the stage. The stage is provided with a temperature adjusting part formed along a circumferential direction of the stage. The temperature control system includes a bypass flow path, a low-temperature flow path and a high-temperature flow path. The bypass flow path is connected to an inlet and an outlet of the temperature adjusting part such that fluid is circulated between the inlet and the outlet. The low-temperature flow path is connected to the bypass flow path such that a low-temperature fluid is supplied from a low-temperature-side temperature adjusting part to the bypass flow path. The high-temperature flow path is connected to the bypass flow path such that a high-temperature fluid is supplied from a high-temperature-side temperature adjusting part to the bypass flow path. Valves whose opening degrees are changed in conjunction with each other are respectively connected to the bypass flow path, the low-temperature flow path and the high-temperature flow path. By controlling the opening degrees of the valves, the temperature control system controls a temperature of the fluid to be supplied to the temperature adjusting part while constantly keeping a flow rate of the fluid.

There is known an apparatus which controls an internal temperature of a reactor to become a target temperature. This apparatus includes a circulation pipe, a hot water supply pipe and a cold water supply pipe. The circulation pipe circulates the water supplied to a cooling jacket of the reactor. The hot water supply pipe circulates hot water therethrough. The cold water supply pipe circulates cold water therethrough. The hot water supply pipe and the cold water supply pipe are connected to a cooling water circulation pipe through a control valve whose opening degree can be adjusted. In this apparatus, a control device calculates a heat exchange amount required in constantly controlling the internal temperature of the reactor and adjusts the opening degree of the control valve, thereby mixing the water existing within the circulation pipe with the hot water existing within the hot water supply pipe or the cold water existing within the cold water circulation pipe at a mixing ratio which can achieve the calculated heat exchange amount. By supplying the mixed water to the reactor at a constant flow rate, the control device controls the internal temperature of the reactor to become the target temperature.

In the aforementioned apparatuses, a heat exchange medium whose temperature is set at a target temperature by mixing heat exchange media having different temperatures is supplied to a temperature control target. Accordingly, the apparatuses require a mechanism for controlling flow rates of a high-temperature heat exchange medium and a low-temperature heat exchange medium to mix the heat exchange media having different temperatures at a desired mixing ratio. As such, the apparatuses suffer from a problem in that the number of parts used to control the temperature of the medium is increased, thereby making a configuration of the temperature control system complicated.

SUMMARY

Some embodiments of the present disclosure provide a temperature control system and a temperature control method which are capable of controlling a temperature of a stage with a simple configuration.

According to one embodiment of the present disclosure, there is provided a temperature control system, including: a stage configured to support a workpiece and provided with a heat exchange medium flow path formed within the stage, the heat exchange medium flow path including a first end and a second end, a heat exchange medium flowing from the first end to the second end of the heat exchange medium flow path; a first valve; a second valve; a first heat exchange medium supply device including a supply port which supplies a first heat exchange medium adjusted to have a first temperature and a recovery port, the supply port being connected to the first end of the heat exchange medium flow path through the first valve; a second heat exchange medium supply device including a supply port which supplies a second heat exchange medium adjusted to have a second temperature higher than the first temperature and a recovery port, the supply port of the second heat exchange medium supply device connected to the first end of the heat exchange medium flow path through the second valve; and a control device configured to control the first valve and the second valve such that the first heat exchange medium and the second heat exchange medium are alternately supplied to the first end of the heat exchange medium flow path, wherein the control device includes: a heat quantity acquiring part configured to acquire a heat quantity required in making a temperature of the stage become equal to a target temperature; a supply time calculating part configured to calculate, based on the required heat quantity, supply times of the first heat exchange medium and the second heat exchange medium alternately supplied to the heat exchange medium flow path; and a valve control part configured to control the first valve and the second valve such that the first heat exchange medium and the second heat exchange medium are alternately supplied to the first end of the heat exchange medium flow path for the supply times calculated at the supply time calculating part.

According to another embodiment of the present disclosure, there is provided a temperature control method for use in a temperature control system, the temperature control system including: a stage configured to support a workpiece and provided with a heat exchange medium flow path formed within the stage, the heat exchange medium flow path including a first end and a second end, a heat exchange medium flowing from the first end to the second end of the heat exchange medium flow path; a first valve; a second valve; a first heat exchange medium supply device including a supply port which supplies a first heat exchange medium adjusted to have a first temperature and a recovery port, the supply port being connected to the first end of the heat exchange medium flow path through the first valve; a second heat exchange medium supply device including a supply port which supplies a second heat exchange medium adjusted to have a second temperature higher than the first temperature and a recovery port, the supply port of the second heat exchange medium supply device connected to the first end of the heat exchange medium flow path through the second valve; and a control device configured to control the first valve and the second valve such that the first heat exchange medium and the second heat exchange medium are alternately supplied to the first end of the heat exchange medium flow path, the method comprising: acquiring a heat quantity required in making a temperature of the stage become equal to a target temperature; calculating, based on the required heat quantity, supply times of the first heat exchange medium and the second heat exchange medium alternately supplied to the heat exchange medium flow path; and controlling the first valve and the second valve such that the first heat exchange medium and the second heat exchange medium are alternately supplied to the first end of the heat exchange medium flow path for the calculated supply times.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 5 is a plan view of a heat exchanger according to one embodiment.

FIG. 16 is a view showing opening/closing states of a first valve and a second valve and temporal changes in temperature of a heat exchange medium supplied to heat exchange medium flow paths.

DETAILED DESCRIPTION

Reference will now be made in detail to various embodiments, examples of which are illustrated in the accompanying drawings. In the respective drawings, identical or equivalent parts will be designated by like reference symbols with no duplicate description made thereon. Dimension ratios in the respective drawings do not necessarily coincide with actual dimension ratios. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

First, a description will be made on a plasma processing apparatus provided with a system according to one embodiment. A stage ST, a valve unit group VU, a first heat exchange medium supply device 100a and a second heat exchange medium supply device 100b constitute a temperature control system 1 according to one embodiment.

Figure 1:
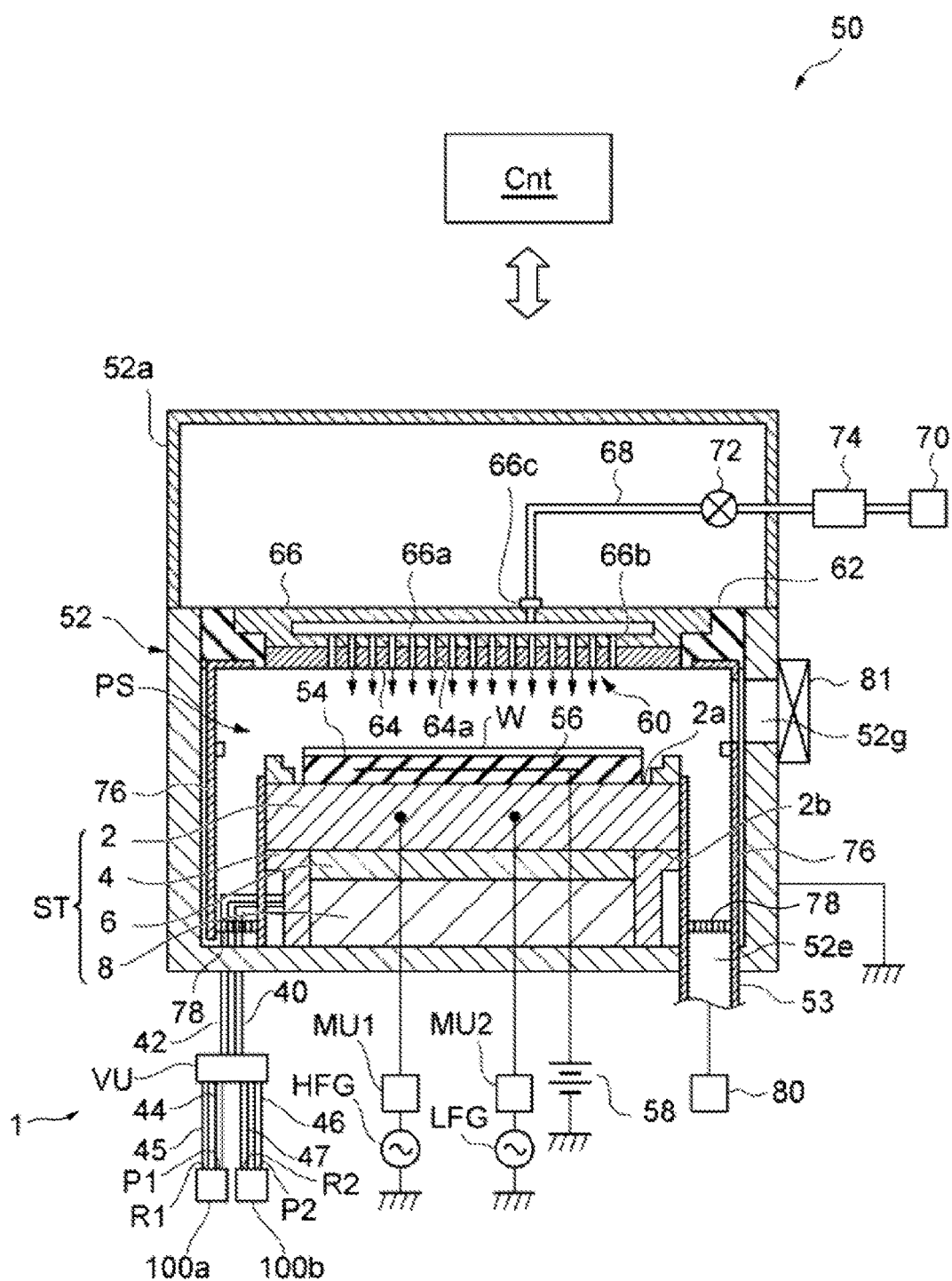
FIG. 1 is a sectional view schematically showing a plasma processing apparatus according to one embodiment.

FIG. 1 is a sectional view schematically showing a plasma processing apparatus 50 according to one embodiment. The plasma processing apparatus 50 used as a capacitively-coupled parallel-plate-type plasma etching apparatus includes a substantially cylindrical processing vessel 52. The processing vessel 52 is made of, e.g., aluminum whose surface is anodized. The processing vessel 52 is grounded.

Figure 2:
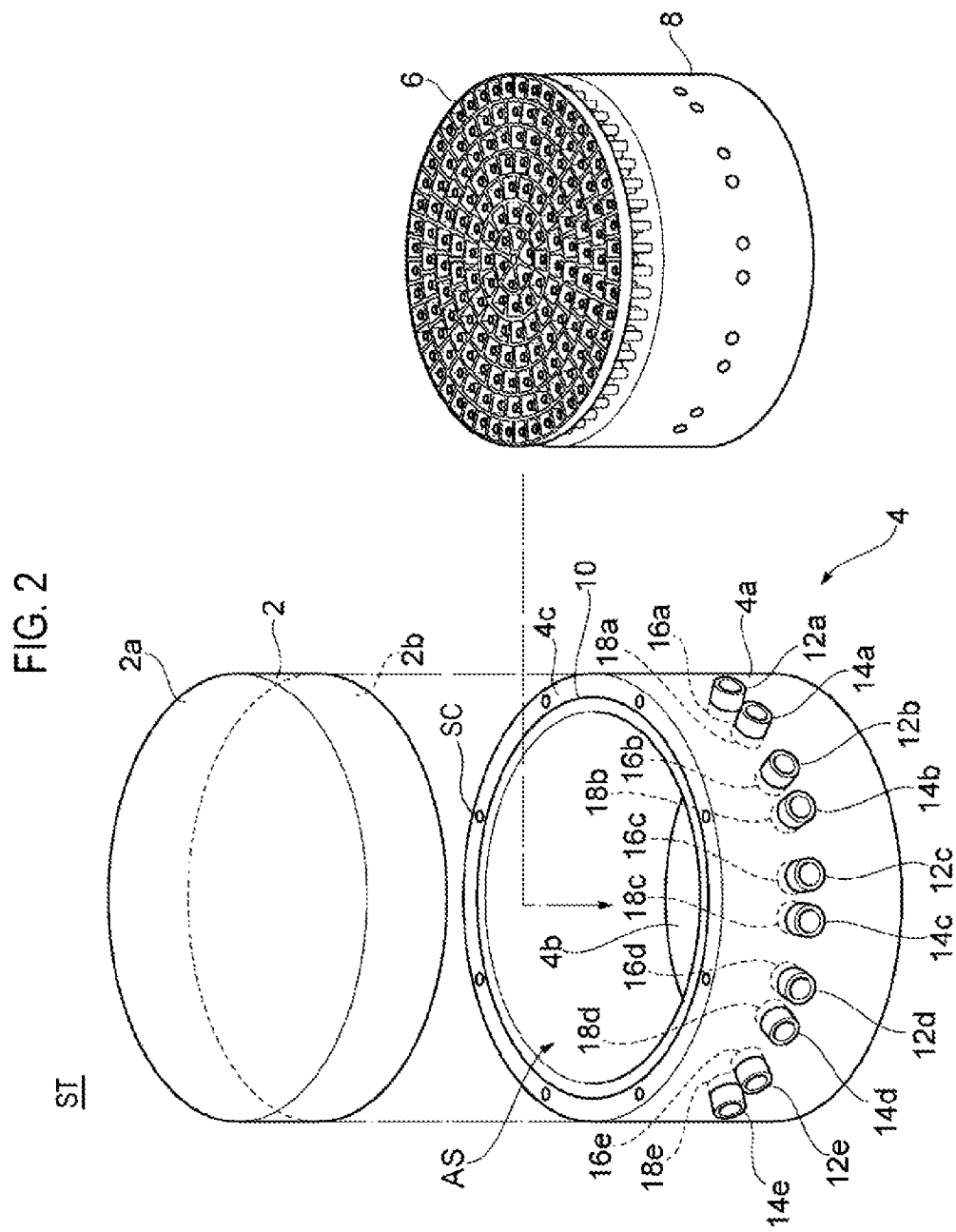
FIG. 2 is an exploded perspective view of a stage according to one embodiment.

A stage ST according to one embodiment is disposed on a bottom portion of the processing vessel 52. As shown in FIG. 1, the stage ST includes a plate 2, a case 4, a heat exchanger 6 and a flow path part 8. Referring to FIG. 2, the stage ST will be described in detail. FIG. 2 is an exploded perspective view of the stage ST. The stage ST shown in FIG. 2 is capable of supporting a workpiece (hereinafter referred to as "substrate") W within the processing vessel 52. A heat exchange medium flow path FC (which will be described later) through which a heat exchange medium flows is formed within the stage ST.

The plate 2 has a disc shape and is made of, e.g., metal such as aluminum or the like. The plate 2 includes a front surface 2a and a rear surface 2b. The substrate W can be mounted on the front surface 2a of the plate 2.

The case 4 is made of, e.g., metal such as stainless steel or the like and includes a sidewall 4a and a bottom wall 4b. The sidewall 4a has a cylindrical shape and defines an accommodating space AS therein. The sidewall 4a extends in a direction of a cylinder axis and supports the plate 2 from an upper end surface 4c. The bottom wall 4b is connected to a lower end portion of the sidewall 4a. In the upper end surface 4c of the sidewall 4a, there may be installed an O-ring 10 which annularly extends along the upper end surface 4c. The plate 2 is air-tightly fixed to the upper end surface 4c through the O-ring 10 by, e.g., screws SC. Thus, the accommodating space AS is defined in the stage ST.

In the sidewall 4a, there are installed a plurality of supply pipes 12a, 12b, 12c, 12d and 12e and a plurality of recovery pipes 14a, 14b, 14c, 14d and 14e. The supply pipes 12a to 12e extend along a radial direction of the sidewall 4a and communicate with the accommodating space AS through first openings 16a, 16b, 16c, 16d and 16e (hereinafter simply referred to as "first openings 16" if there is no need to distinguish them from one another), respectively. The recovery pipes 14a to 14e extend along the radial direction of the sidewall 4a and communicate with the accommodating space AS through second openings 18a, 18b, 18c, 18d and 18e (hereinafter simply referred to as "second openings 18" if there is no need to distinguish them from one another), respectively.

Figure 3:
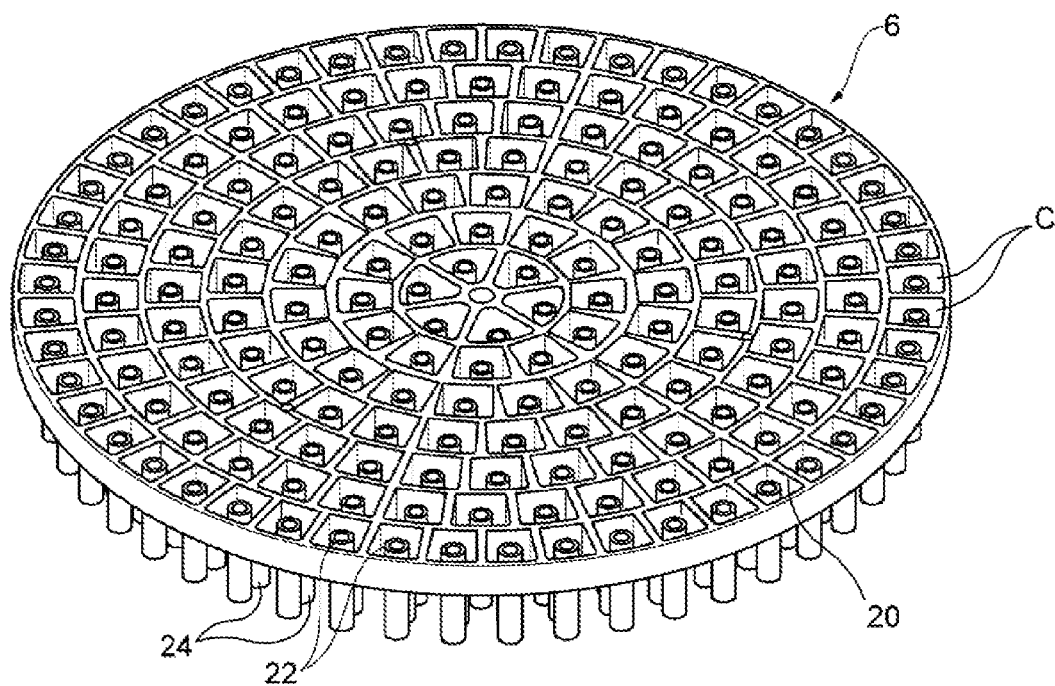
FIG. 3 is a perspective view of a heat exchanger according to one embodiment.

The heat exchanger 6 and the flow path part 8 are accommodated within the accommodating space AS of the case 4. Referring to FIGS. 3 to 5, the heat exchanger 6 will be described in detail. FIG. 3 is a perspective view of the heat exchanger 6. As shown in FIG. 3, the heat exchanger 6 includes a plurality of partition walls 20, a plurality of first pipes 22 and a plurality of second pipes 24. The heat exchanger 6 is configured to individually supply a heat exchange medium to a plurality of regions two-dimensionally arranged in the rear surface 2b of the plate 2. The plurality of regions is defined by circumferentially dividing a plurality of zones bounded by a plurality of concentric circles on the rear surface 2b of the plate 2. The heat exchanger 6 is configured to individually recover the supplied heat exchange medium.

Figure 4A:
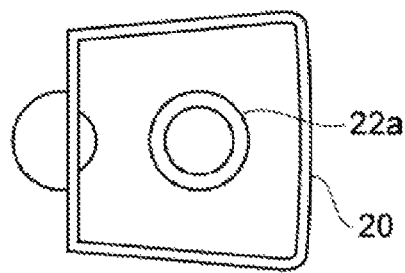
FIG. 4A is a plan view of one of cell parts.
Figure 4B:
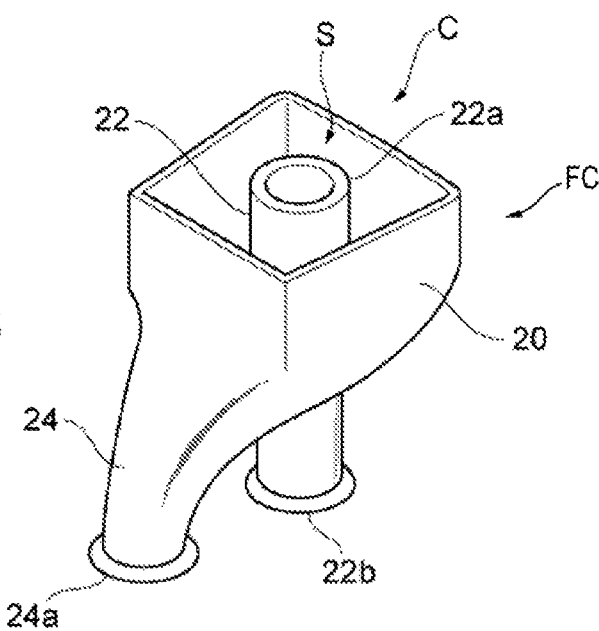
FIG. 4B is a top perspective view of one of the cell parts.
Figure 4C:
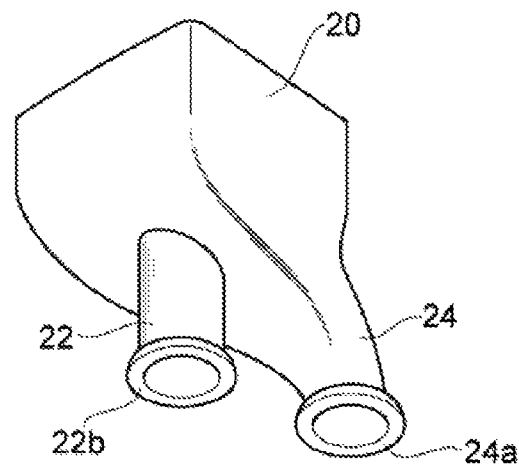
FIG. 4C is a bottom perspective view of one of the cell parts.

Each of the partition walls 20 as a whole is formed in a disc shape or a cylindrical columnar shape. The partition walls 20 include a plurality of cell parts C which is two-dimensionally arranged along radial and circumferential directions of the heat exchanger 6. Each of the cell parts C has a rectangular plane-view shape such that the width thereof grows larger toward the outer side of the heat exchanger 6 when seen from the top. Each of the cell parts C defines a space S having a substantially rectangular cross section. That is to say, the partition walls 20 include the respective spaces S which are two-dimensionally arranged and mutually non-inclusive regions below the plate 2. One of the cell parts C is shown in FIGS. 4A to 4C. FIG. 4A is a plan view of the cell part C, FIG. 4B is a top perspective view of the cell part C, and FIG. 4C is a bottom perspective view of the cell part C. In some embodiments, the cell parts C may be coupled to one another so as to form a honeycomb structure when seen from the top.

The first pipes 22 are installed to extend through substantially central positions of the spaces S, respectively. The first pipes 22 extend toward the rear surface 2b (see FIG. 2) of the plate 2 in a mutually parallel relationship. Each of the first pipes 22 is surrounded by the partition wall 20 which defines the peripheral space thereof. Each of the first pipes 22 includes a first opened end 22a and a second opened end 22b. The first opened end 22a is disposed to face the rear surface 2b of the plate 2. The second opened end 22b is positioned at the opposite side of the first opened end 22a and is located below the space S. Each of the first pipes 22 serves as a pipe which receives a heat exchange medium from the first heat exchange medium supply device 100a or the second heat exchange medium supply device 100b (which will be described later) and ejects the heat exchange medium through the first opened end 22a.

The second pipes 24 are connected to the partition walls 20 so as to communicate with the spaces S, respectively. An opening 24a is formed in a lower end portion of each of the second pipes 24. The second pipes 24 serve as pipes which outwardly discharge the heat exchange medium ejected from the first opened ends 22a of the first pipes 22 and recovered into the spaces S surrounding the first pipes 22, respectively. In the heat exchanger 6 configured as above, the first pipes 22, the partition walls 20 defining the spaces S surrounding the first pipes 22, and the second pipes 24 communicating with the spaces S, provide the heat exchange medium flow paths FC which circulate the heat exchange medium from one end to the other end within the stage ST. The second opened ends 22b of the first pipes 22 constitute first ends of the heat exchange medium flow paths FC while the openings 24a of the second pipes 24 constitute second ends of the heat exchange medium flow paths FC, respectively.

In one embodiment, the heat exchanger 6 may be made of a material mainly composed of resin, ceramic or metal. In order to suppress influence between the cell parts C arranged adjacent to each other, the heat exchanger 6 may be made of a material having low heat conductivity, e.g., ceramic or resin, and especially, resin. In some embodiments, the material of which the heat exchanger 6 is made may be partially changed in order to change a strength or a heat conductivity of the heat exchanger 6. As an example, the first opened ends 22a of the first pipes 22 may be made of resin which contains carbon, ceramic powder, glass fibers, metal powder or the like. This makes it possible to locally increase the strength of the first opened ends 22a. In some embodiments, the heat exchanger 6 may be formed through the use of, e.g., a 3D printer.

FIG. 5 is a plan view of the heat exchanger 6. The heat exchanger 6 is divided into a plurality of zones Z1, Z2, Z3, Z4 and Z5 bounded by a plurality of concentric circles centered at the central axis of the heat exchanger 6. That is to say, the zones Z1, Z2, Z3, Z4 and Z5 are mutually partitioned by a plurality of concentric boundaries B1, B2, B3 and B4. The zone Z1 is an annular region centered at the central axis of the heat exchanger 6 and is positioned along an outer edge portion of the heat exchanger 6. The zones Z2, Z3 and Z4 are annular regions concentric with the zone Z1 and are respectively positioned inward of the zones Z1, Z2 and Z3. The zone Z5 is a circular region positioned inward of the zone Z4 and is located at the center of the heat exchanger 6. Within each of the zones Z1, Z2, Z3, Z4 and Z5, the respective cell parts C are arranged along the circumferential direction. In the boundary B3 of the heat exchanger 6, three holes HL penetrating vertically through the heat exchanger 6 are formed at regions surrounded by the four partition walls 20 of the four cell parts C in four directions. The holes HL are used as holes into which lift-up pins are inserted to lift up the substrate W from a mounting surface.

Figure 6:
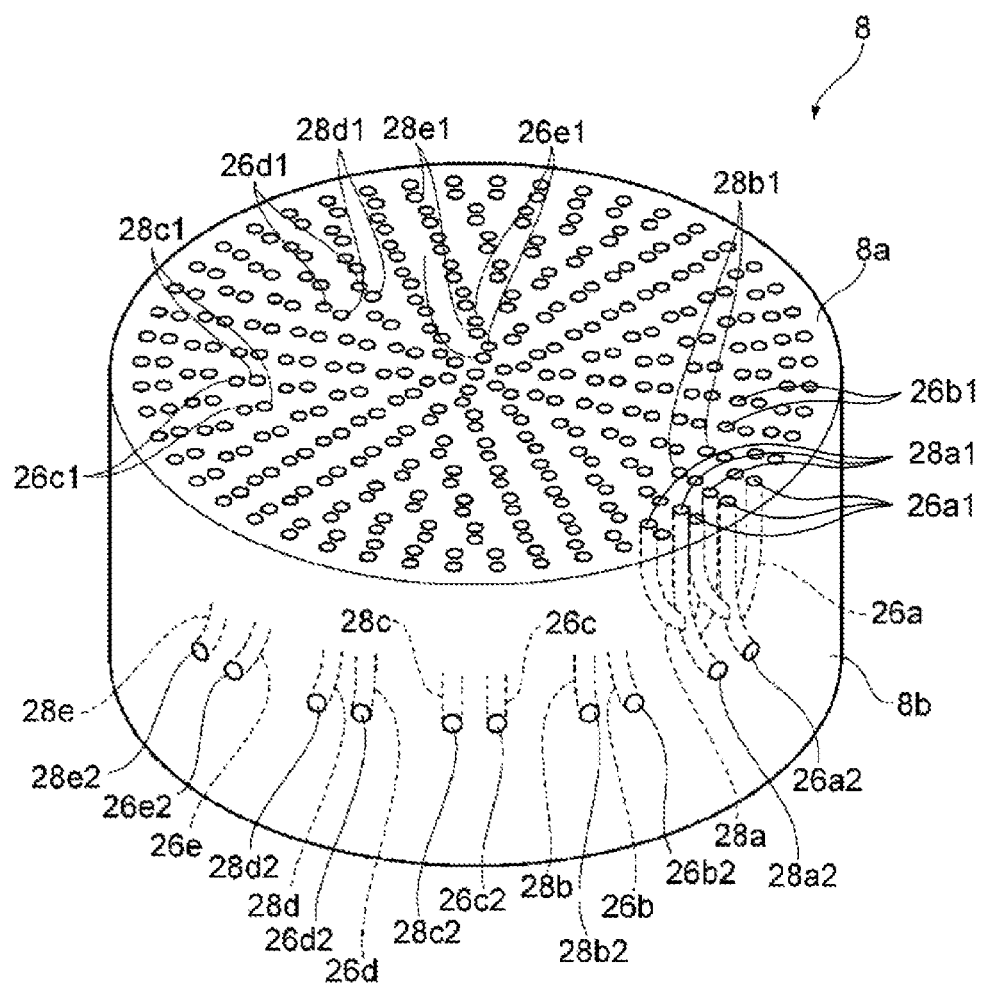
FIG. 6 is a perspective view of a flow path part.

Next, a description will be made on the flow path part 8. FIG. 6 is a perspective view of the flow path part 8. The flow path part 8 is disposed below the heat exchanger 6. The flow path part 8 provides flow paths through which the heat exchange medium is supplied to the heat exchanger 6 and through which the heat exchange medium is recovered from the heat exchanger 6.

As shown in FIG. 6, the flow path part 8 is a substantially circular columnar block and includes an upper surface 8a and a side surface 8b. In the flow path part 8, a plurality of supply flow paths 26a, 26b, 26c, 26d and 26e are formed (hereinafter simply referred to as "supply flow paths 26" if there is no need to distinguish them from one another) to penetrate through the flow path part 8, and a plurality of recovery flow paths 28a, 28b, 28c, 28d and 28e are formed (hereinafter simply referred to as "recovery flow paths 28" if there is no need to distinguish them from one another) to penetrate through the flow path part 8. In the flow path part 8, a plurality of small-diameter cavities are formed to penetrate through the side surface 8b of the flow path part 8 toward the upper surface 8a. These cavities constitute the supply flow paths 26 and the recovery flow paths 28.

The supply flow path 26a is branched at the intermediate position thereof and is provided with a plurality of (e.g., three) first ends 26a1 and one second end 26a2. The first ends 26a1 are respectively formed in the upper surface 8a of the flow path part 8 at positions corresponding to the first pipes 22 arranged within the zone Z1. The first ends 26a1 are respectively connected to the second opened ends 22b of the first pipes 22 arranged within the zone Z1. The second end 26a2 is formed in the side surface 8b of the flow path part 8. The second end 26a2 is formed at a position corresponding to the first opening 16a of the case 4. When the flow path part 8 is accommodated within the case 4, the second end 26a2 is positioned to face the first opening 16a. The supply flow path 26a is used as a flow path for supplying the heat exchange medium introduced through the first opening 16a to the first pipes 22 arranged within the zone Z1 of the heat exchanger 6.

The recovery flow path 28a is branched at the intermediate position thereof and is provided with a plurality of (e.g., three) first ends 28a1 and one second end 28a2. The plurality of first ends 28a1 are formed on the upper surface 8a of the flow path part 8 at positions corresponding to the second pipes 24 arranged within the zone Z1. The first ends 28a1 are respectively connected to the openings 24a of the second pipes 24 arranged within the zone Z1. The second end 28a2 is formed in the side surface 8b of the flow path part 8. The second end 28a2 is formed at a position corresponding to the second opening 18a of the case 4. When the flow path part 8 is accommodated within the case 4, the second end 28a2 is positioned to face the second opening 18a. The recovery flow path 28a is used as a flow path for discharging the heat exchange medium recovered from the heat exchanger 6 through the second pipes 24 arranged within the zone Z1 of the heat exchanger 6, to the outside of the stage ST through the second opening 18a.

Just like the supply flow path 26a, each of the supply flow paths 26b, 26c, 26d and 26e is provided with a plurality of first ends 26b1, 26c1, 26d1 and 26e1 and one second end 26b2, 26c2, 26d2 and 26e2. The plurality of first ends 26b1, 26c1, 26d1 and 26e1 are formed in the upper surface 8a of the flow path part 8 at positions corresponding to the first pipes 22 arranged within the zones Z2, Z3, Z4 and Z5, respectively. The first ends 26b1, 26c1, 26d1 and 26e1 are respectively connected to the second opened ends 22b of the first pipes 22 arranged within the zones Z2, Z3, Z4 and Z5. The second ends 26b2, 26c2, 26d2 and 26e2 are formed in the side surface 8b of the flow path part 8. The second ends 26b2, 26c2, 26d2 and 26e2 are formed at positions corresponding to the first openings 16b, 16c, 16d and 16e of the case 4, respectively. When the flow path part 8 is accommodated within the case 4, the second ends 26b2, 26c2, 26d2 and 26e2 are positioned to face the first openings 16b, 16c, 16d and 16e, respectively. The supply flow paths 26b, 26c, 26d and 26e are used as flow paths for supplying the heat exchange medium introduced through the first openings 16b, 16c, 16d and 16e to the first pipes 22 arranged within the zones Z2, Z3, Z4 and Z5 of the heat exchanger 6, respectively.

Just like the recovery flow path 28a, each of the recovery flow paths 28b, 28c, 28d and 28e is provided with a plurality of first ends 28b1, 28c1, 28d1 and 28e1 and one second end 28b2, 28c2, 28d2 and 28e2, respectively. The first ends 28b1, 28c1, 28d1 and 28e1 are formed in the upper surface 8a of the flow path part 8 at positions corresponding to the second pipes 24 arranged within the zones Z2, Z3, Z4 and Z5, respectively. The first ends 28b1, 28c1, 28d1 and 28e1 are respectively connected to the openings 24a of the second pipes 24 arranged within the zones Z2, Z3, Z4 and Z5. The second ends 28b2, 28c2, 28d2 and 28e2 are formed in the side surface 8b of the flow path part 8. The second ends 28b2, 28c2, 28d2 and 28e2 are formed at positions corresponding to the second opening 18b, 18c, 18d and 18e of the case 4. When the flow path part 8 is accommodated within the case 4, the second ends 28b2, 28c2, 28d2 and 28e2 are positioned to face the second openings 18b, 18c, 18d and 18e, respectively. The recovery flow paths 28b, 28c, 28d and 28e are used as flow paths for discharging the heat exchange medium recovered from the heat exchanger 6 through the second pipes 24 arranged within the zones Z2, Z3, Z4 and Z5 of the heat exchanger 6, to the outside of the stage ST through the second opening 18b, 18c, 18d and 18e, respectively.

The supply flow paths 26 and the recovery flow paths 28 are formed as independent flow paths which do not communicate with each other. In one embodiment, the supply flow paths 26 are equal in conductance to one another and the recovery flow paths 28 are equal in conductance to one another. The term "conductance" used herein is an index which indicates the ease of flow of a fluid and is a value decided depending on the diameter, length and curvature of a flow path. For example, the conductance of each of the supply flow paths 26 and the recovery flow paths 28 is made uniform by adjusting the diameter and the curvature of the flow paths along the length thereof. In one embodiment, for the purpose of suppressing the influence between the adjoining flow paths, the flow path part 8 may be made of a material having low heat conductivity, e.g., a material mainly composed of ceramic or resin. In some embodiments, resin may be used as the material. The flow path part 8 can be formed through the use of, e.g., a 3D printer. Particularly, when installing a multiplicity of, e.g., 100 to 1,000, flow paths, the use of the 3D printer makes it possible to three-dimensionally arrange the flow paths. This is effective in increasing the degree of freedom of design and in making uniform the conductance.

Referring back to FIG. 1, the plasma processing apparatus 50 will be further described. An electrostatic chuck 54 is installed on the front surface 2a of the plate 2 of the stage ST. The electrostatic chuck 54 has a structure in which an electrode 56 as a conductive film is disposed between a pair of insulation layers or insulation sheets. The electrode 56 is electrically connected to a DC power supply 58. The electrostatic chuck 54 can electrostatically suck and hold the substrate W by virtue of an electrostatic force such as a Coulomb force or the like generated by a DC voltage supplied from the DC power supply 58.

The plasma processing apparatus 50 further includes a valve unit group VU disposed outside the processing vessel 52. The valve unit group VU is configured to control the supply or cutoff of the heat exchange medium to the heat exchanger 6 on a zone-by-zone basis. The valve unit group VU includes valve units VU1, VU2, VU3, VU4 and VU5 (see FIG. 7). The term "heat exchange medium" used herein refers to a fluid flowing through the stage ST for the purpose of heat exchange with the plate 2 and denotes a concept which encompasses a cooling medium for absorbing heat from the plate 2 and a heating medium for applying heat to the plate 2. Examples of the heat exchange medium used as the cooling medium may include water, fluorine-based liquid or the like.

Figure 7:
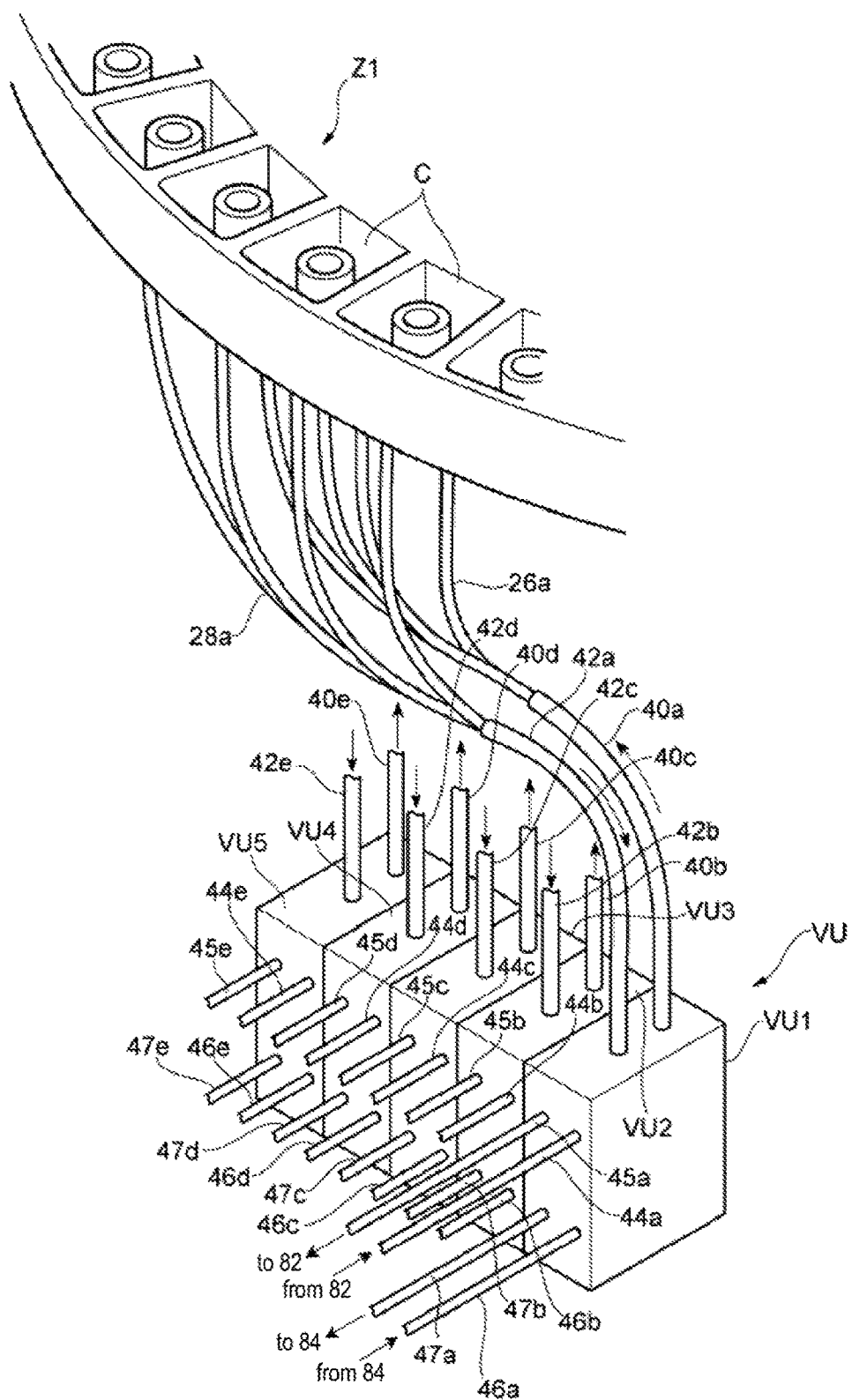
FIG. 7 is a perspective view of a valve unit group.

The valve unit group VU is coupled to a supply port P1 of the first heat exchange medium supply device 100a through a low-temperature fluid supply path 44. Furthermore, the valve unit group VU is coupled to a recovery port R1 of the first heat exchange medium supply device 100a through a low-temperature fluid recovery path 45. The low-temperature fluid supply path 44 is provided with a first end and a second end. The first and second ends are branched into branch ends 44a, 44b, 44c, 44d and 44e. As shown in FIG. 7, the branch ends 44a, 44b, 44c, 44d and 44e are respectively connected to the valve units VU1, VU2, VU3, VU4 and VU5. Furthermore, the low-temperature fluid recovery path 45 is provided with a first end and a second end. The first and second ends are branched into branch ends 45a, 45b, 45c, 45d and 45e. The branch ends 45a, 45b, 45c, 45d and 45e are respectively connected to the valve units VU1, VU2, VU3, VU4 and VU5.

The first heat exchange medium supply device 100a is a device which circularly supplies a heat exchange medium (hereinafter often referred to as "low-temperature fluid") whose temperature is adjusted to a first temperature. At the recovery port R1, the first heat exchange medium supply device 100a recovers the heat exchange medium flowing from the valve units VU1 to VU5 through the low-temperature fluid recovery path 45. The first heat exchange medium supply device 100a cools down the recovered heat exchange medium to the first temperature. At the supply port P1, the first heat exchange medium supply device 100a supplies the heat exchange medium having the first temperature to the valve units VU1 to VU5 through the low-temperature fluid supply path 44. The first temperature may be set to, e.g., 30 degrees C.

Furthermore, the valve unit group VU is coupled to a supply port P2 of the second heat exchange medium supply device 100b through a high-temperature fluid supply path 46. Moreover, the valve unit group VU is coupled to a recovery port R2 of the second heat exchange medium supply device 100b through a high-temperature fluid recovery path 47. The high-temperature fluid supply path 46 is provided with a first end and a second end. The first and second ends are branched into branch ends 46a, 46b, 46c, 46d and 46e. As shown in FIG. 7, the branch ends 46a, 46b, 46c, 46d and 46e are respectively connected to the valve units VU1, VU2, VU3, VU4 and VU5. Furthermore, the high-temperature fluid recovery path 47 is provided with a first end and a second end. The first and second ends are branched into branch ends 47a, 47b, 47c, 47d and 47e. The branch ends 47a, 47b, 47c, 47d and 47e are respectively connected to the valve units VU1, VU2, VU3, VU4 and VU5.

The second heat exchange medium supply device 100b is a device which circularly supplies a heat exchange medium (hereinafter often referred to as "high-temperature fluid") whose temperature is adjusted to a second temperature higher than the first temperature. At the recovery port R2, the second heat exchange medium supply device 100b recovers the heat exchange medium flowing from the valve units VU1 to VU5 through the high-temperature fluid recovery path 47. The second heat exchange medium supply device 100b heats the recovered heat exchange medium to the second temperature. The second heat exchange medium supply device 100b supplies the heat exchange medium having the second temperature to the valve units VU1 to VU5 through the high-temperature fluid supply path 46. The second temperature is a temperature higher than a target temperature and may be set to, e.g., 90 degrees C.

Next, a description will be made on the valve units VU1, VU2, VU3, VU4 and VU5 of the valve unit group VU. As shown in FIG. 7, the valve unit VU1 is coupled to the supply flow path 26a through a first pipe line 40a. Furthermore, the valve unit VU1 is coupled to the recovery flow path 28a through a second pipe line 42a. In one example, the first pipe line 40a and the second pipe line 42a can be connected to the supply flow path 26a and the recovery flow path 28a by being inserted into the supply pipe 12a and the recovery pipe 14a of the case 4, respectively. The valve unit VU1 has a function of permitting or inhibiting the supply of the heat exchange medium from the first heat exchange medium supply device 100a or the second heat exchange medium supply device 100b to the first pipes 22 arranged within the zone Z1. Furthermore, the valve unit VU1 has a function of selectively switching the low-temperature fluid supplied through the low-temperature fluid supply path 44 and the high-temperature fluid supplied through the high-temperature fluid supply path 46 to the heat exchange medium to be supplied to the first pipes 22 arranged within the zone Z1.

Just like the valve unit VU1, the valve units VU2, VU3, VU4 and VU5 are respectively coupled to the supply flow paths 26b, 26c, 26d and 26e through first pipe lines 40b, 40c, 40d and 40e. Furthermore, the valve units VU2, VU3, VU4 and VU5 are respectively coupled to the recovery flow paths 28b, 28c, 28d and 28e through second pipe lines 42b, 42c, 42d and 42e. The valve units VU2, VU3, VU4 and VU5 have functions of permitting or inhibiting the supply of the heat exchange medium from the first heat exchange medium supply device 100a or the second heat exchange medium supply device 100b to the first pipes 22 arranged within each of the zones Z2, Z3, Z4 and Z5, respectively. Furthermore, the valve units VU2, VU3, VU4 and VU5 have functions of selectively switching the low-temperature fluid supplied through the low-temperature fluid supply path 44 and the high-temperature fluid supplied through the high-temperature fluid supply path 46 to the heat exchange medium to be supplied to the first pipes 22 arranged within the zones Z2, Z3, Z4 and Z5, respectively.

In one embodiment, the temperature control system 1 may further include temperature sensors configured to measure a temperature of the heat exchange medium discharged from the second ends of the heat exchange medium flow paths FC, i.e., the openings 24a of the second pipes 24. In one embodiment, the second pipe lines 42a to 42e may include temperature sensors TS configured to measure the temperature of the heat exchange medium flowing through the second pipe lines 42a to 42e, respectively (see FIG. 9). With these temperature sensors TS, the temperature of the stage ST can be calculated by measuring the temperature of the heat exchange medium discharged through the second pipes 24.

Referring back to FIG. 1 again, an upper electrode 60 is installed within the processing vessel 52. The upper electrode 60 is disposed above the plate 2 serving as a lower electrode, while facing the plate 2. The plate 2 and the upper electrode 60 are installed in a substantially parallel relationship with each other. A processing space PS where, e.g., plasma etching, is performed on the substrate W, is defined between the upper electrode 60 and the plate 2.

The upper electrode 60 is supported on a top portion of the processing vessel 52 through an insulating shield member 62. The upper electrode 60 may include an electrode plate 64 and an electrode support body 66. The electrode plate 64 is disposed to face the processing space PS and includes a plurality of gas ejection holes 64a defined therein. The electrode plate 64 may be configured by a low-resistance conductor or semiconductor which is small in Joule heat. The electrode plate 64 is grounded.

The electrode support body 66 is configured to detachably support the electrode plate 64 and may be made of, e.g., a conductive material such as aluminum or the like. The electrode support body 66 may have a water-cooling structure. A gas diffusion chamber 66a is formed within the electrode support body 66. A plurality of gas flow holes 66b communicating with the respective gas ejection holes 64a extends downward from the gas diffusion chamber 66a. A gas introduction port 66c through which a process gas is introduced into the gas diffusion chamber 66a is formed in the electrode support body 66. The gas introduction port 66c is connected to a gas supply pipe 68.

The gas supply pipe 68 is coupled to a gas source 70 via a series of a valve 72 and a mass flow controller (MFC) 74. A flow control system (FCS) may be installed in place of the MFC 74. The gas source 70 is a source of the process gas. The process gas supplied from the gas source 70 is introduced into the gas diffusion chamber 66a through the gas supply pipe 68, and subsequently, is ejected into the processing space PS through the gas flow holes 66b and the gas ejection holes 64a.

The plasma processing apparatus 50 may further include a grounding conductor 52a. The grounding conductor 52a has a substantially cylindrical shape and is installed so as to extend upward beyond a height position of the upper electrode 60 from the sidewall of the processing vessel 52.

Furthermore, in the plasma processing apparatus 50, a deposit shield 76 is detachably installed along an inner wall of the processing vessel 52. The deposit shield 76 is also installed on an outer periphery of the stage ST. The deposit shield 76 serves to prevent an etching byproduct (or a deposit) from adhering to the processing vessel 52. The deposit shield 76 may be configured by coating an aluminum material with ceramics such as $Y_2O_3$ or the like.

At a bottom side of the processing vessel 52, an exhaust plate 78 is installed between the stage ST and the inner wall of the processing vessel 52. The exhaust plate 78 may be configured by, for example, coating an aluminum material with ceramics such as $Y_2O_3$ or the like. In the processing vessel 52, an exhaust port 52e is formed below the exhaust plate 78. The exhaust port 52e is coupled to an exhaust device 80 through an exhaust pipe 53. The exhaust device 80 is provided with a vacuum pump such as a turbo molecular pump or the like. The exhaust device 80 can depressurize the interior of the processing vessel 52 to a desired degree of vacuum. Furthermore, a carry-in/carry-out gate 52g through which the substrate W is transferred is formed in the sidewall of the processing vessel 52. The carry-in/carry-out gate 52g can be opened and closed by a gate valve 81.

In one embodiment, the plasma processing apparatus 50 further includes a high-frequency power supply HFG, a high-frequency power supply LFG, a matcher MU1 and a matcher MU2. The high-frequency power supply HFG is designed to generate a high-frequency power for the generation of plasma. The high-frequency power supply HFG is configured to supply the high-frequency power having a frequency of 27 MHz or higher, e.g., 40 MHz, to the plate 2 via the matcher MU1. The matcher MU1 is provided with a circuit which is configured to match an internal (or output) impedance of the high-frequency power supply HFG with a load impedance. The high-frequency power supply LFG is designed to generate a high-frequency bias power for the implantation of ions. The high-frequency power supply LFG is configured to supply high-frequency bias power having a frequency of 13.56 MHz or lower, e.g., 3 MHz, to the plate 2 via the matcher MU2. The matcher MU2 is provided with a circuit which is configured to match an internal (or output) impedance of the high-frequency power supply LFG with a load impedance. In some embodiments, the lower electrode may be installed independently of the plate 2.

In one embodiment, the plasma processing apparatus 50 may further include a control part Cnt. The control part Cnt is a computer which includes a processor, a memory part, an input device, a display device, and so forth. The control part Cnt is configured to control respective parts of the plasma processing apparatus 50, such as a power supply system, a gas supply system, a drive system and the like. The control device Cnt can individually control the valve units VU1 to VU5. Through the control part Cnt, an operator can perform a command input manipulation or the like using the input device in order to manage the plasma processing apparatus 50. Furthermore, the operating situation of the plasma processing apparatus 50 can be visually displayed on the display device. Moreover, the memory part of the control part Cnt stores a control program for enabling the processor to control various kinds of processes implemented by the plasma processing apparatus 50, and a program, namely a process recipe, for causing the respective parts of the plasma processing apparatus 50 to implement respective processes pursuant to processing conditions.

Figure 8:
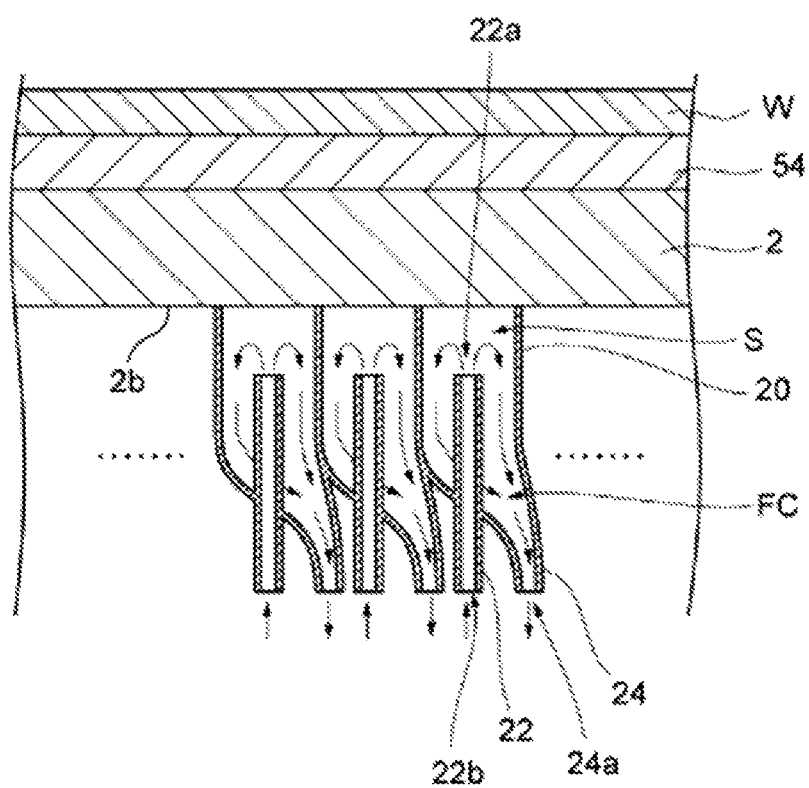
FIG. 8 is a sectional view schematically showing a flow of a heat exchange medium within a heat exchanger.

Next, a description will be made on the flow of the heat exchange medium within the stage ST. FIG. 8 is a sectional view schematically showing the flow of the heat exchange medium within the heat exchanger 6.

The heat exchange medium supplied from the first heat exchange medium supply device 100a or the second heat exchange medium supply device 100b into the stage ST through the first openings 16 passes through the supply flow paths 26 of the flow path part 8, followed by flowing into the first pipes 22 through the second opened ends 22b. The heat exchange medium introduced through the second opened ends 22b flows upward along the first pipes 22, followed by being discharged from the first opened ends 22a toward the rear surface 2b of the plate 2. The heat exchange medium discharged from the first opened ends 22a makes contact with the rear surface 2b of the plate 2 facing the first opened ends 22a, whereby heat exchange is performed between the heat exchange medium and the plate 2. The heat exchange medium subjected to the heat exchange moves downward along the partition wall 20, followed by being discharged through the openings 24a of the second pipes 24 to the outside of the spaces S. The heat exchange medium discharged from the spaces S is returned to the first heat exchange medium supply device 100a or the second heat exchange medium supply device 100b via the recovery flow paths 28 connected to the openings 24a, the second pipe lines 42a to 42e and the second openings 18.

As described above, the heat exchanger 6 is configured such that the heat exchange medium is individually ejected from the first pipes, followed by being recovered by the second pipes 24 through the respective spaces S. That is to say, the first pipes 22, the partition walls 20 defining the plurality of spaces S and the second pipes 24 provide a plurality of heat exchange medium flow paths FC which circulate the heat exchange medium within the stage ST. The heat exchange medium flow paths FC are mutually-independent flow paths of the heat exchange medium and are two-dimensionally arranged when viewed from the top. With the heat exchange medium flow paths FC, the heat exchange medium is individually supplied to a plurality of regions two-dimensionally arranged in the rear surface 2b of the plate 2. This suppresses a difference in the temperature of the heat exchange medium supplied from the first pipes 22 to the regions two-dimensionally arranged in the rear surface 2b of the plate 2, from being generated.

Figure 9:
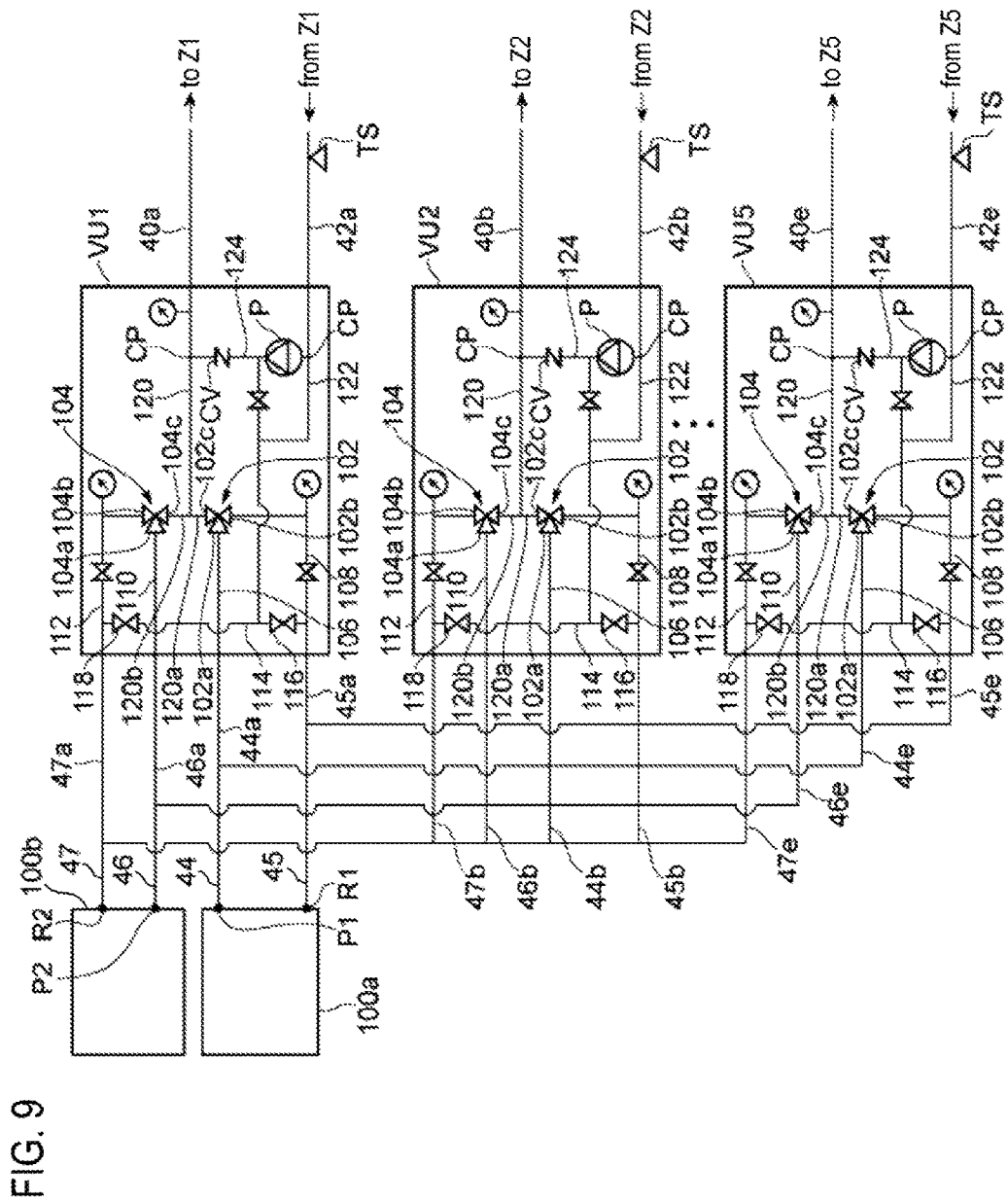
FIG. 9 is a view schematically showing an internal configuration of the valve unit group.

Next, the valve units VU1 to VU5 will be described in detail with reference to FIG. 9. As shown in FIG. 9, the valve units VU1 to VU5 are identical in configuration with one another. Therefore, the following description will be primarily focused on the valve unit VU1. The valve unit VU1 is disposed between the first heat exchange medium supply device 100a and the second heat exchange medium supply device 100b and the heat exchanger 6.

The valve unit VU1 includes a first valve 102 and a second valve 104. The first valve 102 is a three-way valve which includes a first port 102a, a second port 102b and a third port 102c. The second valve 104 is a three-way valve which includes a first port 104a, a second port 104b and a third port 104c. The first valve 102 and the second valve 104 are configured such that they can be opened and closed independently of each other.

The first port 102a of the first valve 102 is connected to one end of a first supply line 106. The other end of the first supply line 106 is connected to the supply port P1 of the first heat exchange medium supply device 100a through the branch end 44a of the low-temperature fluid supply path 44. The second port 102b of the first valve 102 is connected to one end of a first recovery line 108. The other end of the first recovery line 108 is connected to the recovery port R1 the first heat exchange medium supply device 100a through the branch end 45a of the low-temperature fluid recovery path 45.

The first port 104a of the second valve 104 is connected to one end of a second supply line 110. The other end of the second supply line 110 is connected to the supply port P2 the second heat exchange medium supply device 100b through the branch end 46a of the high-temperature fluid supply path 46. The second port 104b of the second valve 104 is connected to one end of a second recovery line 112. The other end of the second recovery line 112 is connected to the recovery port R2 the second heat exchange medium supply device 100b through the branch end 47a of the high-temperature fluid recovery path 47.

A first bypass line 114 parallel-connected to the second recovery line 112 is connected to the intermediate position of the first recovery line 108. A third valve 116 and a fourth valve 118 are serially connected to the first bypass line 114. The third valve 116 and the fourth valve 118 are two-way valves whose opening and closing can be controlled independently of each other.

The third port 102c of the first valve 102 and the third port 104c of the second valve 104 are connected to one end of a common line 120 via a first line 120a and a second line 120b, respectively. The first line 120a is connected to the third port 102c of the first valve 102. The second line 120b is connected to the third port 104c of the second valve 104. The other end of the common line 120 is connected to the first pipes 22 arranged within the zone Z1 of the heat exchanger 6, via the first pipe line 40a and the supply flow path 26a.

A return line 122 is located in the valve unit VU1, one end of which is connected to the second pipe line 42a and the other end of which is connected to the first bypass line 114 at a position existing between the third valve 116 and the fourth valve 118. Both ends of a second bypass line 124 are respectively connected to connection points CP located at an intermediate position of the return line 122 and at an intermediate position of the common line 120. A pump P and a check valve CV are installed in the second bypass line 124. The second bypass line 124 constitutes a portion of a circulation flow path through which the heat exchange medium discharged through the second pipes 24 is re-introduced into the first pipes 22.

As described above, the supply port P1 of the first heat exchange medium supply device 100a is coupled to the first ends of the heat exchange medium flow paths FC, i.e., the second opened ends 22b of the first pipes 22, through the first valve 102. The recovery port R1 of the first heat exchange medium supply device 100a is coupled to second ends of the heat exchange medium flow paths FC, i.e., the openings 24a of the second pipes 24, through the third valve 116. Furthermore, the supply port P2 of the second heat exchange medium supply device 100b is coupled to the first ends of the heat exchange medium flow paths FC, i.e., the second opened ends 22b of the first pipes 22, through the second valve 104. The recovery port R2 of the second heat exchange medium supply device 100b is coupled to the second ends of the heat exchange medium flow paths FC, i.e., the openings 24a of the second pipes 24, through the fourth valve 118.

The valve units VU2, VU3, VU4 and VU5 are identical in configuration with the valve unit VU1. One end of the common lines 120 of the valve units VU2, VU3, VU4 and VU5 are respectively connected to the first pipes 22 arranged within the zones Z2, Z3, Z4 and Z5, via the supply flow paths 26b, 26c, 26d and 26e, respectively. Furthermore, the first valve 102, the second valve 104, the third valve 116 and the fourth valve 118 of each of the valve units VU2, VU3, VU4 and VU5 are configured such that the opening and closing thereof can be controlled independently of each other.

Next, a description will be made on flow routes of the heat exchange medium. The system according to one embodiment can switch the flow state of the heat exchange medium to a first flow state, a second flow state or a third flow state by controlling the opening and closing of various kinds of valves within the valve unit group VU based on a control signal transmitted from the control part Cnt. In the first flow state, a low-temperature fluid is supplied to the respective zones of the heat exchanger 6. In the second flow state, a high-temperature fluid is supplied to the respective zones of the heat exchanger 6. In the third flow state, the supply of the low-temperature fluid and the high-temperature fluid to the heat exchanger 6 is cut off such that the heat exchange medium discharged from the openings 24a of the second pipes 24 are circularly supplied to the second opened ends 22b of the first pipes 22 via the second bypass line 124.

[First Flow State]

First, a description will be made on the first flow state. In the case of the first flow state, the first valve 102 is controlled such that the connection between the first port 102a and the second port 102b is cut off while the connection between the first port 102a and the third port 102c is permitted. The second valve 104 is controlled such that the connection between the first port 104a and the second port 104b is permitted while the connection between the first port 104a and the third port 104c is cut off. Furthermore, the third valve 116 is opened and the fourth valve 118 is closed.

In the first flow state, the low-temperature fluid flowing inward from the supply port P1 of the first heat exchange medium supply device 100a through the branch end 44a of the low-temperature fluid supply path 44 flows through the first supply line 106, the first line 120a and the common line 120, and subsequently, is supplied to the first pipes 22 arranged within the zone Z1, through the first pipe line 40*a* and the supply flow paths 26*a*. The heat exchange medium recovered from the second pipes 24 arranged within the zone Z1 flows into the valve unit VU1 through the recovery flow path 28*a* and the second pipe line 42*a*. The heat exchange medium flowing into the valve unit VU1 is moved through the return line 122, the third valve 116 in the first bypass line 114 and the first recovery line 108 and subsequently, is returned to the recovery port R1 of the first heat exchange medium supply device 100*a* through the branch end 45*a* of the low-temperature fluid recovery path 45.

On the other hand, the high-temperature fluid flowing inward from the supply port P2 of the second heat exchange medium supply device 100*b* through the branch end 46*a* of the high-temperature fluid supply path 46 is moved through the second supply line 110 and the second recovery line 112 and is returned to the recovery port R2 of the second heat exchange medium supply device 100*b* without flowing into the common line 120. As mentioned above, in the first flow state, the low-temperature fluid is supplied to the first pipes 22 arranged within the zone Z1 of the heat exchanger 6, while the supply of the high-temperature fluid to the first pipes 22 arranged within the zone Z1 of the heat exchanger 6 is cut off.

[Second Flow State]

Next, a description will be made on the second flow state. In case of the second flow state, the first valve 102 is controlled such that the connection between the first port 102*a* and the second port 102*b* is permitted while the connection between the first port 102*a* and the third port 102*c* is cut off. The second valve 104 is controlled such that the connection between the first port 104*a* and the second port 104*b* is cut off while the connection between the first port 104*a* and the third port 104*c* is permitted. Furthermore, the third valve 116 is closed and the fourth valve 118 is opened.

In the second flow state, the low-temperature fluid flowing inward from the supply port P1 of the first heat exchange medium supply device 100*a* through the branch end 44*a* of the low-temperature fluid supply path 44 is moved through the first supply line 106 and the first recovery line 108 and subsequently, is returned to the recovery port R1 of the first heat exchange medium supply device 100*a* without flowing into the common line 120.

On the other hand, the high-temperature fluid flowing inward from the supply port P2 of the second heat exchange medium supply device 100*b* through the branch end 46*a* of the high-temperature fluid supply path 46 is moved through the second supply line 110, the second line 120*b* and the common line 120 and subsequently, is supplied into the first pipes 22 arranged within the zone Z1, via the first pipe line 40*a* and the supply flow path 26*a*. The heat exchange medium recovered from the second pipes 24 arranged within the zone Z1 is introduced into the valve unit VU1 through the recovery flow path 28*a* and the second pipe line 42*a*. The heat exchange medium introduced into the valve unit VU1 is moved through the return line 122, the fourth valve 118 in the first bypass line 114 and the second recovery line 112 and subsequently, is returned to the recovery port R2 of the second heat exchange medium supply device 100*b* through the branch end 47*a* of the high-temperature fluid recovery path 47. As mentioned above, in the second flow state, the high-temperature fluid is supplied to the first pipes 22 arranged within the zone Z1 of the heat exchanger 6, while the supply of the low-temperature fluid to the first pipes 22 is cut off.

[Third Flow State]

Next, a description will be made on the third flow state. In case of the third flow state, the first valve 102 is controlled such that the connection between the first port 102*a* and the second port 102*b* is permitted while the connection between the first port 102*a* and the third port 102*c* is cut off. The second valve 104 is controlled such that the connection between the first port 104*a* and the second port 104*b* is permitted while the connection between the first port 104*a* and the third port 104*c* is cut off. Furthermore, the third valve 116 and the fourth valve 118 are closed.

In the third flow state, the low-temperature fluid flowing inward from the supply port P1 of the first heat exchange medium supply device 100*a* through the branch end 44*a* of the low-temperature fluid supply path 44 is moved through the first supply line 106 and the first recovery line 108 and subsequently, is returned to the recovery port R1 of the first heat exchange medium supply device 100*a* without flowing into the common line 120. The high-temperature fluid flowing inward from the supply port P2 of the second heat exchange medium supply device 100*b* through the branch end 46*a* of the high-temperature fluid supply path 46 is moved through the second supply line 110 and the second recovery line 112 and subsequently, is returned to the recovery port R2 of the second heat exchange medium supply device 100*b* without flowing into the common line 120. That is to say, in the third flow state, the supply of both the low-temperature fluid and the high-temperature fluid to the heat exchanger 6 is cut off.

When coming into the first flow state or the second flow state in the past, the heat exchange medium remains within the heat exchanger 6. This heat exchange medium is circulated through the flow paths by the operation of the pump P installed in the second bypass line 124. More specifically, the heat exchange medium existing within the heat exchanger 6 is introduced into the valve unit VU1 through the recovery flow path 28*a* and the second pipe line 42*a*. Subsequently, the heat exchange medium flows through a portion of the return line 122, the second bypass line 124 and a portion of the common line 120, followed by being circularly supplied to the first pipes 22 arranged within the zone Z1, via the first pipe line 40*a* and the supply flow paths 26*a*. In the following description, flow paths configured by the portion of the return line 122, the second bypass line 124, the portion of the common line 120, the first pipe lines 40*a*, the supply flow path 26, the first pipes 22, the partition walls 20 defining the spaces S, the second pipes 24, the recovery flow path 28 and the second pipe lines 42*a* will be referred to as "circulation flow paths". With the third flow state, the supply of the low-temperature fluid from the first heat exchange medium supply device 100*a* to the heat exchanger 6 and the supply of the high-temperature fluid from the second heat exchange medium supply device 100*b* to the heat exchanger 6 are cut off. The heat exchange medium discharged from the openings 24*a* of the second pipes 24 is supplied to the second opened ends 22*b* of the first pipes 22 via the circulation flow paths.

As described above, the valve unit VU1 is configured such that the low-temperature fluid and the high-temperature fluid can be supplied to a plurality of regions without mixing them with each other by independently controlling the opening and closing of the respective ports of the valve unit VU1. That is to say, with the valve unit VU1, the heat exchange medium to be supplied to the first pipes 22 arranged within the zone Z1 can be instantly switched to the low-temperature fluid or the high-temperature fluid. Even in the case of the valve units VU2, VU3, VU4 and VU5, the heat exchange medium to be supplied to the first pipes 22 can be instantly switched to the low-temperature fluid or the high-temperature fluid.

Figure 10:
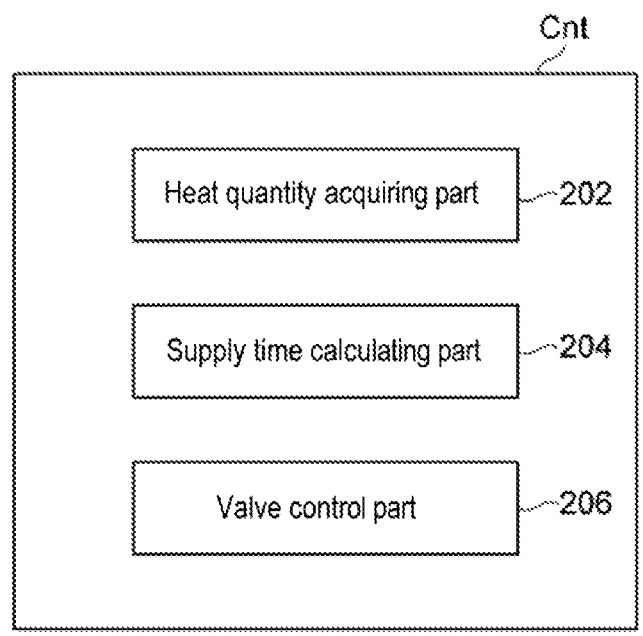
FIG. 10 is a block diagram showing a functional configuration of a control device.

Next, the control device Cnt will be described in detail. The control device Cnt controls the first valve 102 and the second valve 104 such that the low-temperature fluid and the high-temperature fluid are alternately supplied to the first ends of the heat exchange medium flow paths FC. FIG. 10 is a block diagram showing a functional configuration of the control device Cnt. As shown in FIG. 10, the control part Cnt includes a heat quantity acquiring part 202, a supply time calculating part 204 and a valve control part 206. The heat quantity acquiring part 202 is a functional element which acquires a heat quantity required in making the temperature of the stage ST become equal to a target temperature. The supply time calculating part 204 is a functional element which calculates supply times of the low-temperature fluid and the high-temperature fluid to be alternately supplied to the heat exchange medium flow paths FC, based on the required heat quantity acquired at the heat quantity acquiring part 202. The valve control part 206 is a functional element which controls the first valve 102 and the second valve 104 such that the low-temperature fluid and the high-temperature fluid are alternately supplied to the first ends of the heat exchange medium flow paths FC.

Figure 11:
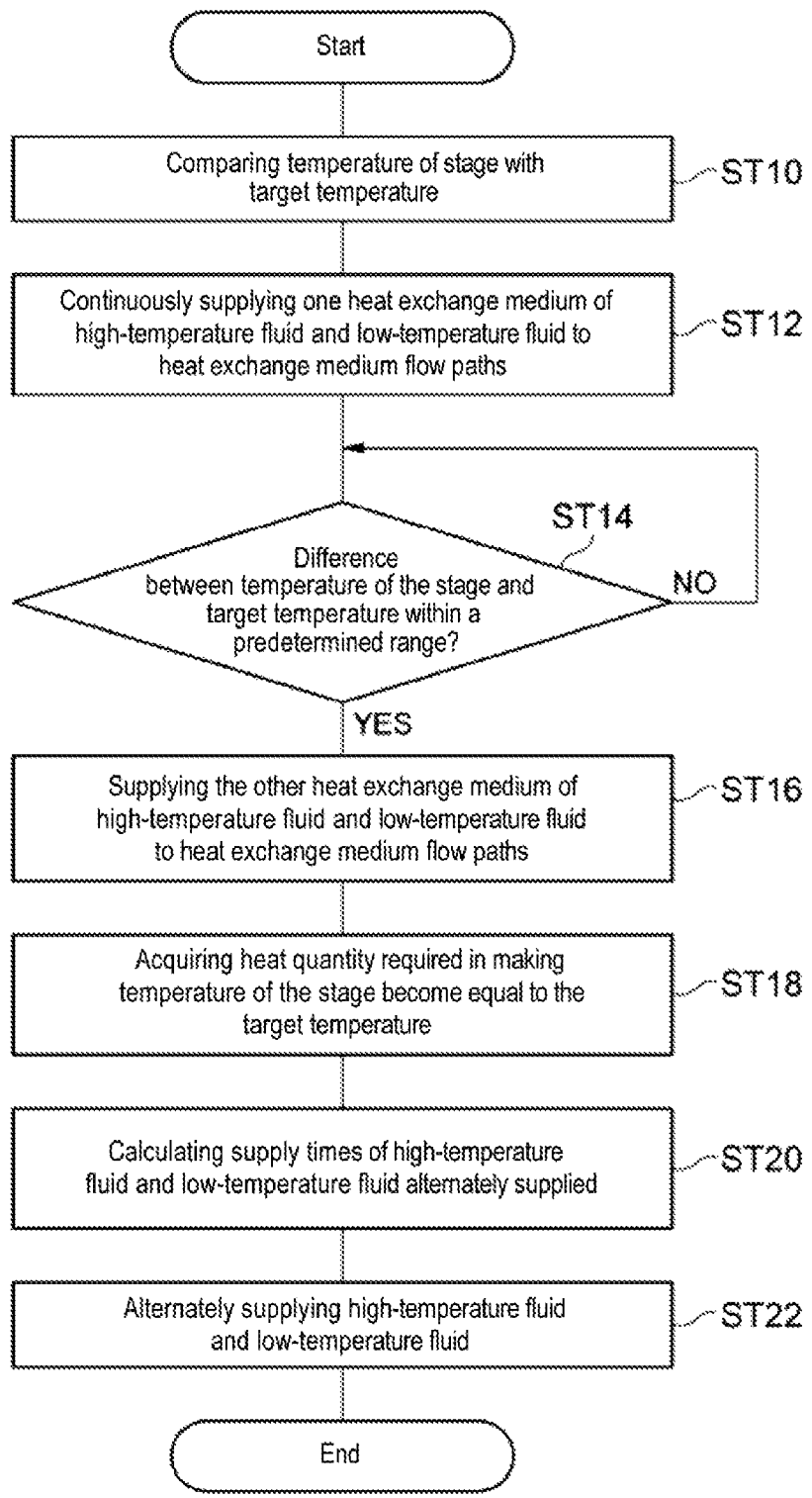
FIG. 11 is a flowchart showing a temperature control method according to one embodiment.
Figure 12:
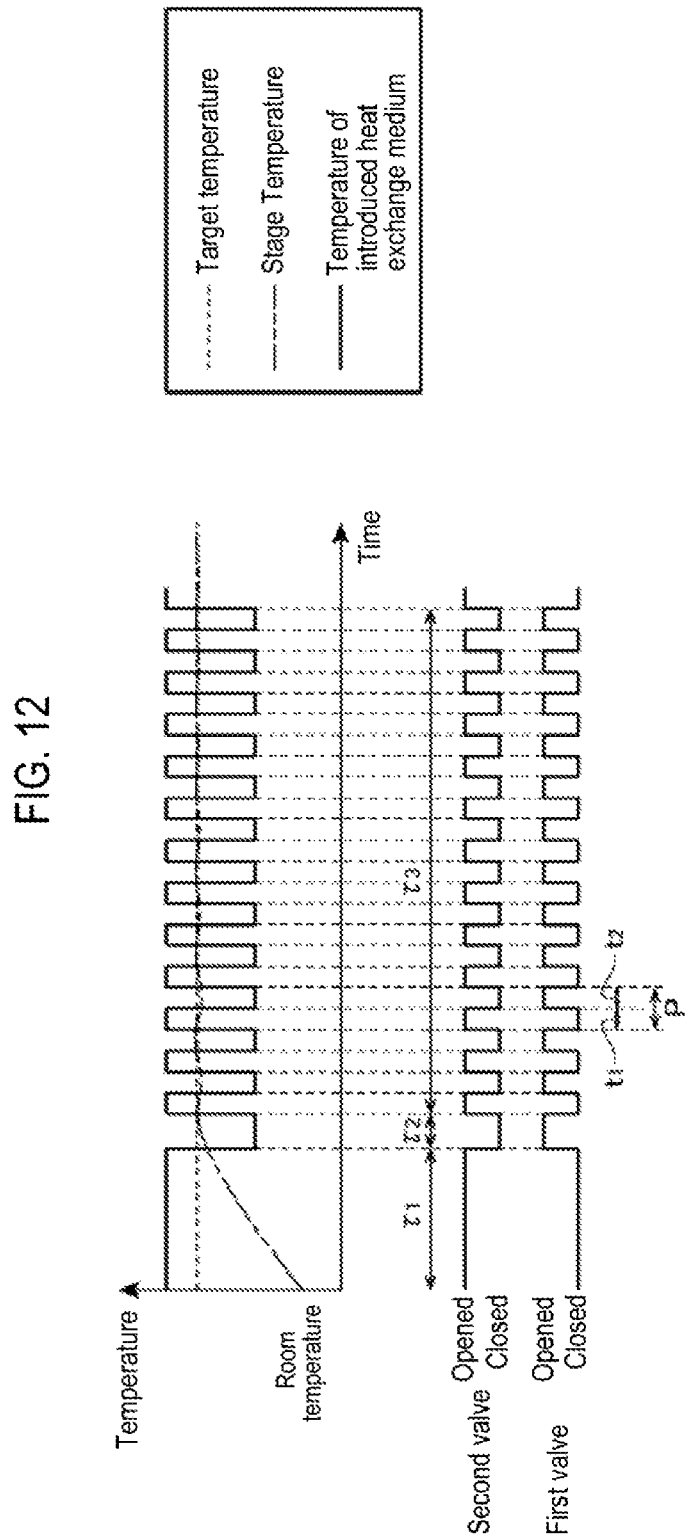
FIG. 12 is a view showing opening/closing states of a first valve and a second valve and temporal changes in temperature of a heat exchange medium supplied to heat exchange medium flow paths.

FIG. 11 is a flowchart showing a temperature control method according to another embodiment. FIG. 12 is a view showing opening/closing states of the first valve 102 and the second valve 104 and temporal changes in temperature of the heat exchange medium supplied to the heat exchange medium flow paths FC. Referring now to FIGS. 11 and 12, descriptions will be made on a control process of the control device Cnt and the temperature control method according to another embodiment.

First, at step ST10, the control device Cnt acquires the temperature of the stage ST from the measurement values of the temperature sensors TS and compares the temperature of the stage ST with a target temperature. The temperature of the stage ST is indirectly acquired by, for example, measuring the temperature of the heat exchange medium flowing out from the openings 24a of the second pipes 24 through the use of the temperature sensors TS installed in the second pipe lines 42a to 42e. In some embodiments, the control device Cnt may calculate a the amount of heat lost within the stage ST, based on a difference between the temperature of the heat exchange medium supplied to the first pipes 22 and the temperature of the heat exchange medium discharged from the openings 24a of the second pipes 24, and may acquire the temperature of the stage ST based on the calculated heat quantity. The target temperature is acquired from a control recipe stored in the memory part of the control device Cnt. Subsequently, at step ST12, the valve control part 206 controls the first valve 102 and the second valve 104 such that one heat exchange medium of the low-temperature fluid and the high-temperature fluid is continuously supplied to the first ends of the heat exchange medium flow paths FC, i.e., the second opened ends 22b of the first pipes 22. One heat exchange medium mentioned above refers to the low-temperature fluid or the high-temperature fluid whichever is suitable for making the temperature of the stage ST come close to the target temperature. For example, if the target temperature is 60 degrees C. and if the temperature of the stage ST is 25 degrees C., the valve control part 206 closes the third port 102c of the first valve 102 and opens the third port 104c of the second valve 104 such that the high-temperature fluid having a temperature of, e.g., 90 degrees C., is continuously supplied to the first pipes 22. By performing step ST12, the temperature of the stage ST rapidly increases toward the target temperature as indicated by a time period $\tau_1$ in FIG. 12.

Subsequently, at step ST14, the control device Cnt determines whether the difference between the temperature of the stage ST and the target temperature falls within a predetermined range. If the difference between the temperature of the stage ST and the target temperature does not fall within the predetermined range, the determination process of step ST14 is repeated until the difference between the temperature of the stage ST and the target temperature comes into the predetermined range. If the difference between the temperature of the stage ST and the target temperature falls within the predetermined range, step ST16 is performed. At step ST16, the valve control part 206 controls the first valve 102 and the second valve 104 such that the other heat exchange medium of the low-temperature fluid and the high-temperature fluid, which differs from the one heat exchange medium supplied at step ST12, is supplied to the first ends of the heat exchange medium flow paths FC, i.e., the second opened ends 22b of the first pipes 22. For example, if the temperature of the stage ST is brought close to the target temperature by the supply of the high-temperature fluid to the first pipes 22, the valve control part 206 opens the third port 102c of the first valve 102 and closes the third port 104c of the second valve 104. Thus, the low-temperature fluid is ejected from the first pipes 22. Consequently, as indicated by a time period $\tau_2$ in FIG. 12, the increase in the temperature of the stage ST is stopped so that the stage ST is prevented from being excessively heated.

Subsequently, at step ST18, the heat quantity acquiring part 202 acquires a heat quantity required in making the temperature of the stage ST become equal to the target temperature. In some embodiments, a table in which a target temperature of the stage ST is associated with a heat quantity required in achieving the target temperature is previously stored in the memory part of the control device Cnt. The relationship between the target temperature and the heat quantity required in achieving the target temperature is decided depending on specifications of the stage ST such as a heat conductivity and a heat radiation amount of the stage ST. This relationship is obtained in advance from actual measurement values obtained using the stage ST. The heat quantity acquiring part 202 acquires the heat quantity required in achieving the target temperature, by referring to the table stored in the memory part.

Subsequently, at step ST20, the supply time calculating part 204 calculates the supply times of the low-temperature fluid and the high-temperature fluid alternately supplied to the heat exchange medium flow paths FC, based on the required heat quantity acquired at the heat quantity acquiring part 202. In this regard, the supply times of the low-temperature fluid and the high-temperature fluid alternately supplied to the heat exchange medium flow paths FC denote the supply time of the low-temperature fluid over time (hereinafter referred to as "circulation period") taken for the heat exchange medium to go around the circulation flow path and the supply time of the high-temperature fluid per the circulation period. In other words, it can be said that the supply times of the low-temperature fluid and the high-temperature fluid alternately supplied to the heat exchange medium flow paths FC are the supply time of the low-temperature fluid per one period and the supply time of the high-temperature fluid per one period, when assuming that the low-temperature fluid and the high-temperature fluid are alternately and periodically supplied to the heat exchange medium flow paths FC in the circulation period. A description will now be made on one example of a method of calculating the supply times of the low-temperature fluid and the high-temperature fluid alternately supplied to the heat exchange medium flow paths FC. However, the method of calculating the supply times of the low-temperature fluid and the high-temperature fluid is not limited to the method to be described below.

[One Example of Method of Calculating Supply Times of the Low-Temperature Fluid and the High-Temperature Fluid]

A method of calculating the supply times of the low-temperature fluid and the high-temperature fluid will now be described under the following assumption:

Length L of the circulation flow path: 6 [m]
Diameter D of the circulation flow path: 6.35 [mm]
Flow rate F of the heat exchange medium: 3 [l/min]
Temperature $T_1$ of the high-temperature fluid: 90 [degrees C.]
Temperature $T_2$ of the low-temperature fluid: 30 [degrees C.]
Specific heat C of the high-temperature fluid and the low-temperature fluid: 1 [J/g·K]
Target temperature of the stage ST: 60 [degrees C.]

First, the supply time calculating part 204 calculates the total amount M of the heat exchange medium circulating through the circulation flow path, based on the length L and the diameter D of the circulation flow path. The total amount M of the heat exchange medium is calculated by the following formula (1):

$$M = \pi/4 \cdot D_2 \cdot L = 0.19 \text{ (l)} \approx 0.20 \text{ (l)} \tag{1}$$

Thereafter, the supply time calculating part 204 calculates the time taken for the heat exchange medium to go around the circulation flow path, i.e., the circulation period P. The circulation period P is calculated by the following formula (2):

$$P = M/F \cdot 60 = 3.8 \text{ (s)} \approx 4.0 \text{ (s)} \tag{2}$$

Then, the supply time calculating part 204 calculates a supply amount $m_1$ of the high-temperature fluid per the circulation period P using a relational expression represented by the following formula (3). In this regard, assuming that the heat quantity Q required in making the temperature of the stage ST acquired at the heat quantity acquiring part 202 become equal to the target temperature (i.e., 60 degrees C.) is 7 [cal], the supply amount $m_1$ of the high-temperature fluid is calculated as represented by the following formula (4):

$$Q = m_1 \cdot C \cdot (T_1 - T_0) + m_2 \cdot C \cdot (T_2 - T_0) = 60 m_1 + 1 \tag{3}$$

$$m_1 = 0.1 \text{ [l]} \tag{4}$$

Then, a supply amount $m_2$ of the low-temperature fluid is calculated by the following formula (5):

$$m_2 = M - m_1 = 0.1 \text{ [l]} \tag{5}$$

Subsequently, the supply time calculating part 204 calculates a supply time $t_1$ of the high-temperature fluid per the circulation period P and a supply time $t_2$ of the low-temperature fluid per the circulation period P, based on the supply amount $m_1$ of the high-temperature fluid per the circulation period P and the supply amount $m_2$ of the low-temperature fluid per the circulation period P. In the aforementioned example, the ratio of the supply amount $m_1$ of the high-temperature fluid and the supply amount $m_2$ of the low-temperature fluid is 1:1. Thus, the supply time calculating part 204 distributes the circulation period P to the supply time $t_1$ of the high-temperature fluid and the supply time $t_2$ of the low-temperature fluid at a ratio of 1:1. That is to say, the supply time calculating part 204 calculates the supply time $t_1$ of the high-temperature fluid to be 2.0 [s] and calculates the supply time $t_2$ of the low-temperature fluid to be 2.0 [s].

Thereafter, at step ST22, the valve control part 206 controls the first valve 102 and the second valve 104 such that the high-temperature fluid and the low-temperature fluid are alternately supplied to the first ends of the heat exchange medium flow paths FC during the supply time $t_1$ of the high-temperature fluid and the supply time $t_2$ of the low-temperature fluid calculated at the supply time calculating part 204. More specifically, as indicated by a time period $T_3$ in FIG. 12, the valve control part 206 repeats, during the circulation period P, a control process by which the third port 102c of the first valve 102 is opened for the supply time $t_2$ of the low-temperature fluid and the third port 104c of the second valve 104 is opened for the supply time $t_1$ of the high-temperature fluid. In this example, the valve control part 206 repeats, during the circulation period P of 4 seconds, the control process by which the third port 102c of the first valve 102 is opened for 2 seconds and the third port 104c of the second valve 104 is opened for 2 seconds. In some embodiments, during the circulation period P of 4 seconds, the valve control part 206 may repeat the control process twice by which the third port 102c of the first valve 102 is opened for 1 second and the third port 104c of the second valve 104 is opened for 1 second. By virtue of this control process, the high-temperature fluid and the low-temperature fluid is alternately ejected from the first pipes 22 toward the rear surface 2b of the plate 2 without being mixed with each other. The heat quantity applied to the plate 2 by the high-temperature fluid and the low-temperature fluid alternately ejected is the heat quantity required in making the temperature of the stage ST acquired at the heat quantity acquiring part 202 become equal to the target temperature. Accordingly, by virtue of this control process, the temperature of the stage ST is stably maintained at the target temperature.

In some embodiments, the valve control part 206 may control the respective valves of the valve units VU1 to VU5 so as to achieve another flow state differing from the first to third flow states described above. As an example, the valve control part 206 may control the respective valves such that, while supplying the low-temperature fluid to the first pipes 22, the heat exchange medium recovered through the second pipes 24 is returned to the second heat exchange medium supply device 100b. Alternatively, the valve control part 206 may control the respective valves such that, while supplying the high-temperature fluid to the first pipes 22, the heat exchange medium recovered through the second pipes 24 is returned to the first heat exchange medium supply device 100a. In some embodiments, the valve control part 206 may control the third valve 116 and the fourth valve 118 such that the heat-exchanged low-temperature fluid recovered from the second pipes 24 is introduced into the recovery port R1 of the first heat exchange medium supply device 100a and such that the heat-exchanged high-temperature fluid recovered from the second pipes 24 is introduced into the recovery port R2 of the second heat exchange medium supply device 100b. By doing so, the heat-exchanged low-temperature fluid is recovered to the first heat exchange medium supply device 100a while the heat-exchanged high-temperature fluid is recovered to the second heat exchange medium supply device 100b. Accordingly, it is possible to reduce the temperature difference between the supplied heat exchange medium and the recovered heat exchange medium. This makes it possible to reduce a load borne by the first heat exchange medium supply device 100a and the second heat exchange medium supply device 100b.

In the temperature control system 1 described above, the supply times of a first heat exchange medium and a second heat exchange medium alternately supplied to the heat exchange medium flow paths FC are calculated based on the heat quantity Q required in making the temperature of the stage ST become equal to the target temperature. The opening and closing of the first valve 102 and the second valve 104 are controlled such that, during the supply times thus calculated, the first heat exchange medium and the second heat exchange medium are alternately supplied to the heat exchange medium flow paths FC. That is to say, in the temperature control system 1, the temperature of the stage ST is controlled by controlling the opening times of the first valve 102 and the second valve 104. Therefore, according to the temperature control system 1, the temperature of the stage ST can be controlled without having to use a mechanism for controlling the flow rate of the heat exchange medium. Furthermore, in the temperature control system 1, there is no need to install a tank or a stirring part which achieves a specified target temperature by previously mixing two heat exchange mediums having different set temperatures. Therefore, according to the temperature control system 1, it is possible to control the temperature of the stage ST with a simple configuration.

Figure 15:
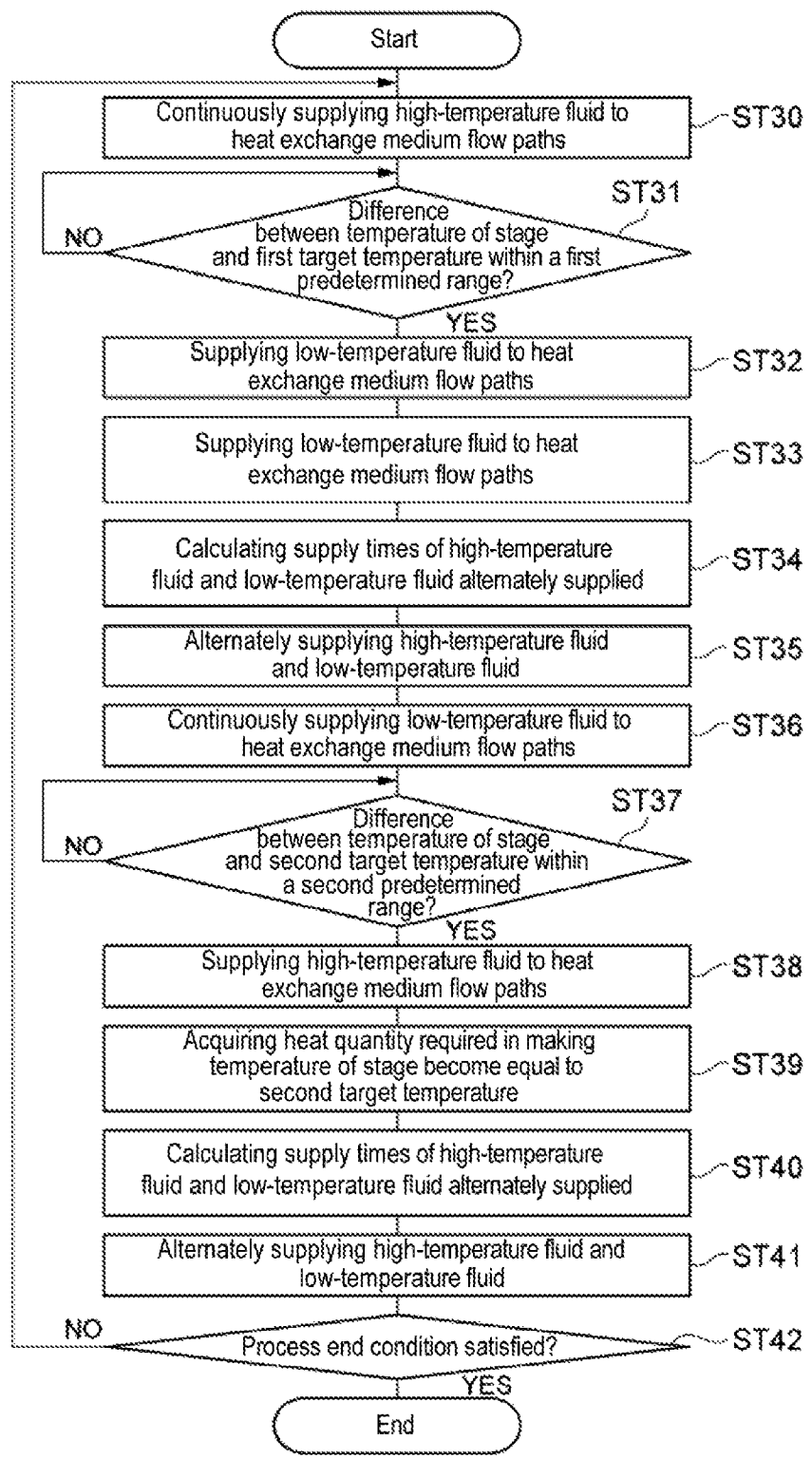
FIG. 15 is a flowchart showing a temperature control method according to another embodiment.

Next, a description will be made on a temperature control method according to another embodiment. FIG. 15 is a flowchart showing a temperature control method according to another embodiment. In the temperature control method shown in FIG. 15, controlling the temperature of the stage to have a first target temperature and controlling the temperature of the stage to have a second target temperature are alternately performed. The first target temperature may be, e.g., 150 degrees C., which is higher than the second target temperature. The second target temperature may be, e.g., 25 degrees C., which is lower than the first target temperature. In the temperature control method shown in FIG. 15, the high-temperature fluid is adjusted to have a temperature higher than the first target temperature while the low-temperature fluid is adjusted to have a temperature lower than the second target temperature.

In the temperature control method shown in FIG. 15, the temperature of the stage ST is first controlled to become the first target temperature. To do this, at step ST30, the first valve 102 and the second valve 104 are controlled such that the high-temperature fluid is continuously supplied to the first ends of the heat exchange medium flow paths FC, i.e., the second opened ends 22b of the first pipes 22. More specifically, the third port 102c of the first valve 102 is closed and the third port 104c of the second valve 104 is opened. By performing step ST30, the temperature of the stage ST is rapidly increased toward the first target temperature as indicated by a time period $T_1$ in FIG. 16.

Subsequently, at step ST31, the control device Cnt determines whether a difference between the temperature of the stage ST and the first target temperature falls within a first predetermined range. If the difference between the temperature of the stage ST and the first target temperature does not fall within the first predetermined range, the determination process of step ST31 is repeated until the difference between the temperature of the stage ST and the first target temperature comes into the first predetermined range. If the difference between the temperature of the stage ST and the first target temperature falls within the first predetermined range, step ST32 is performed.

At step ST32, the valve control part 206 controls the first valve 102 and the second valve 104 such that the low-temperature fluid is supplied to the first ends of the heat exchange medium flow paths FC, i.e., the second opened ends 22b of the first pipes 22. More specifically, if the temperature of the stage ST is brought close to the first target temperature by the supply of the high-temperature fluid, the valve control part 206 opens the third port 102c of the first valve 102 and closes the third port 104c of the second valve 104. Thus, the low-temperature fluid is ejected from the first pipes 22. Consequently, as indicated by a time period $T_2$ in FIG. 16, the increase in the temperature of the stage ST is stopped so that the stage ST is prevented from being excessively heated.

Subsequently, at step ST33, the heat quantity acquiring part 202 acquires a heat quantity required in making the temperature of the stage ST become equal to the first target temperature. Then, at step ST34, the supply time calculating part 204 calculates the supply times of the low-temperature fluid and the high-temperature fluid alternately supplied to the heat exchange medium flow paths FC, based on the required heat quantity acquired at the heat quantity acquiring part 202. Thereafter, at step ST35, the valve control part 206 controls the first valve 102 and the second valve 104 such that the low-temperature fluid and the high-temperature fluid are alternately supplied to the first ends of the heat exchange medium flow paths FC for the supply time of the high-temperature fluid and the supply time of the low-temperature fluid calculated at the supply time calculating part 204. These calculation and control processes performed at steps ST33, ST34 and ST35 are the same as the calculation and control processes performed at steps ST18, ST20 and ST22 shown in FIG. 11 and, therefore, will not be described here in detail. As the low-temperature fluid and the high-temperature fluid are alternately supplied in this way, the temperature of the stage ST is stably maintained at the first target temperature as indicated by a time period $\tau_3$ in FIG. 16.

Subsequently, step ST36 is performed to make the temperature of the stage ST become equal to the second target temperature. At step ST36, the first valve 102 and the second valve 104 are controlled such that the low-temperature fluid is continuously supplied to the first ends of the heat exchange medium flow paths FC, i.e., the second opened ends 22b of the first pipes 22. More specifically, the third port 102c of the first valve 102 is opened and the third port 104c of the second valve 104 is closed. By performing step ST36, the temperature of the stage ST is rapidly decreased toward the second target temperature as indicated by a time period $\tau_4$ in FIG. 16.

Subsequently, at step ST37, the control device Cnt determines whether a difference between the temperature of the stage ST and the second target temperature falls within a second predetermined range. If the difference between the temperature of the stage ST and the second target temperature does not fall within the second predetermined range, the determination process of step ST37 is repeated until the difference between the temperature of the stage ST and the second target temperature comes into the second predetermined range. If the difference between the temperature of the stage ST and the second target temperature falls within the second predetermined range, step ST38 is performed.

At step ST38, the valve control part 206 controls the first valve 102 and the second valve 104 such that the high-temperature fluid is supplied to the first ends of the heat exchange medium flow paths FC, i.e., the second opened ends 22b of the first pipes 22. More specifically, the valve control part 206 closes the third port 102c of the first valve 102 and opens the third port 104c of the second valve 104. Thus, the high-temperature fluid is ejected from the first pipes 22. Consequently, as indicated by a time period $T_5$ in FIG. 16, the decrease in the temperature of the stage ST is stopped so that the stage ST is prevented from being excessively cooled.

Subsequently, at step ST39, the heat quantity acquiring part 202 acquires a heat quantity required in making the temperature of the stage ST become equal to the second target temperature. Then, at step ST40, the supply time calculating part 204 calculates the supply times of the low-temperature fluid and the high-temperature fluid alternately supplied to the heat exchange medium flow paths FC, based on the required heat quantity acquired at the heat quantity acquiring part 202. Thereafter, at step ST41, the valve control part 206 controls the first valve 102 and the second valve 104 such that the low-temperature fluid and the high-temperature fluid are alternately supplied to the first ends of the heat exchange medium flow paths FC for the supply time of the low-temperature fluid and the supply time of the high-temperature fluid calculated at the supply time calculating part 204. These calculation and control processes performed at steps ST39, ST40 and ST41 are the same as the calculation and control processes performed at steps ST18, ST20 and ST22 shown in FIG. 11 and, therefore, will not be described here in detail. As the low-temperature fluid and the high-temperature fluid are alternately supplied in this way, the temperature of the stage ST is stably maintained at the second target temperature as indicated by a time period $\tau_6$ in FIG. 16.

Subsequently, step ST42 is performed. At step ST42, determination is made as to whether a process end condition is satisfied. In some embodiments, the satisfaction or non-satisfaction of the process end condition may be determined by, for example, determining whether the number of switching times of the temperature of the stage ST to the first target temperature and the second target temperature has reached a predetermined number of times. If it is determined at step ST42 that the process end condition is satisfied, the temperature control method shown in FIG. 15 is ended. On the other hand, if it is determined at step ST42 that the process end condition is not satisfied, a sequence of steps ST30 to ST41 is repeatedly performed until the process end condition is satisfied.

In the temperature control method shown in FIG. 15, the temperature of the stage ST is maintained at the target temperatures by controlling the opening time of the third port 102c of the first valve 102 and the opening time of the third port 104c of the second valve 104. Thus, according to this method, it is possible to stably maintain the temperature of the stage ST without having to use a mechanism for controlling the flow rate of the heat exchange medium. Furthermore, in the temperature control method shown in FIG. 15, when the target temperature of the stage ST is switched from the first target temperature to the second target temperature, the low-temperature fluid having a temperature lower than the second target temperature is continuously supplied to the heat exchange medium flow paths FC. This enables the temperature of the stage ST to approach the second target temperature within a short period of time. As described above, according to the method shown in FIG. 15, it is possible to improve the responsiveness of the temperature control.

Figure 13:
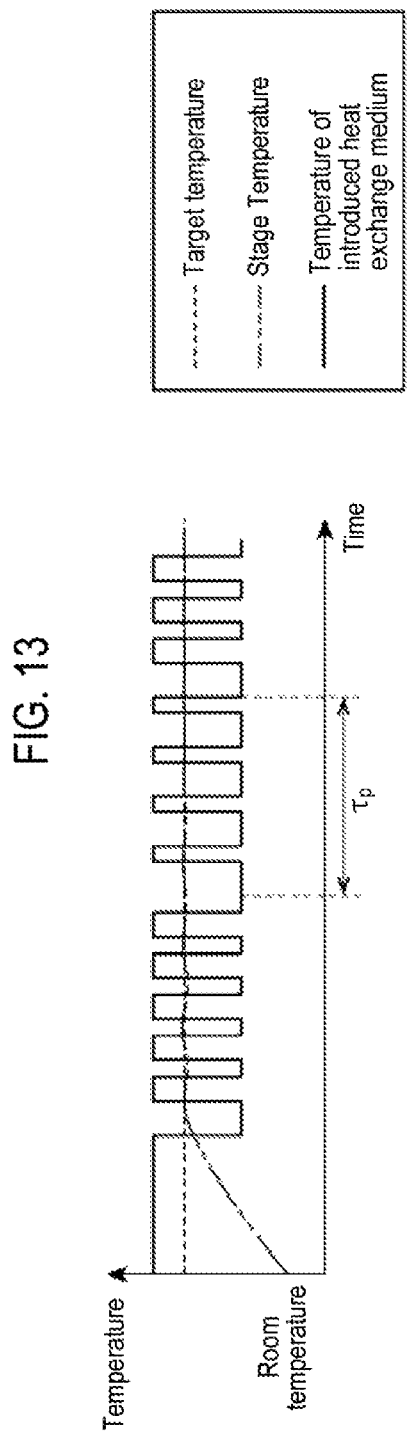
FIG. 13 is a view showing opening/closing states of a first valve and a second valve and temporal changes in temperature of a heat exchange medium supplied to heat exchange medium flow paths.

While some embodiments of the present disclosure have been described above, the present disclosure is not limited to the above-described embodiments but may be modified in many different forms. In some embodiments, if there is a period for which heat is applied from the outside to the stage ST in the course of processing a substrate W, the supply time $t_1$ of the high-temperature fluid and the supply time $t_2$ of the low-temperature fluid may be calculated during this period through the use of a heat quantity Q which reflects the heat applied from the outside. As an example, if heat generated by plasma is applied to the stage ST, the required heat quantity Q may be calculated by subtracting the heat quantity applied to the stage ST by plasma from the required heat quantity stored in the table. In this configuration, as shown in FIG. 13, during a plasma generation period $\tau_p$, the supply time $t_1$ of the high-temperature fluid is shortened and the supply time $t_2$ of the low-temperature fluid is prolonged. Thus, the heat quantity supplied from the heat exchange medium to the stage ST can be reduced just as much as the heat quantity applied to the stage ST by plasma. Therefore, even if heat is applied from the outside to the stage ST, the temperature of the stage ST can be stably maintained at the target temperatures.

Figure 14:
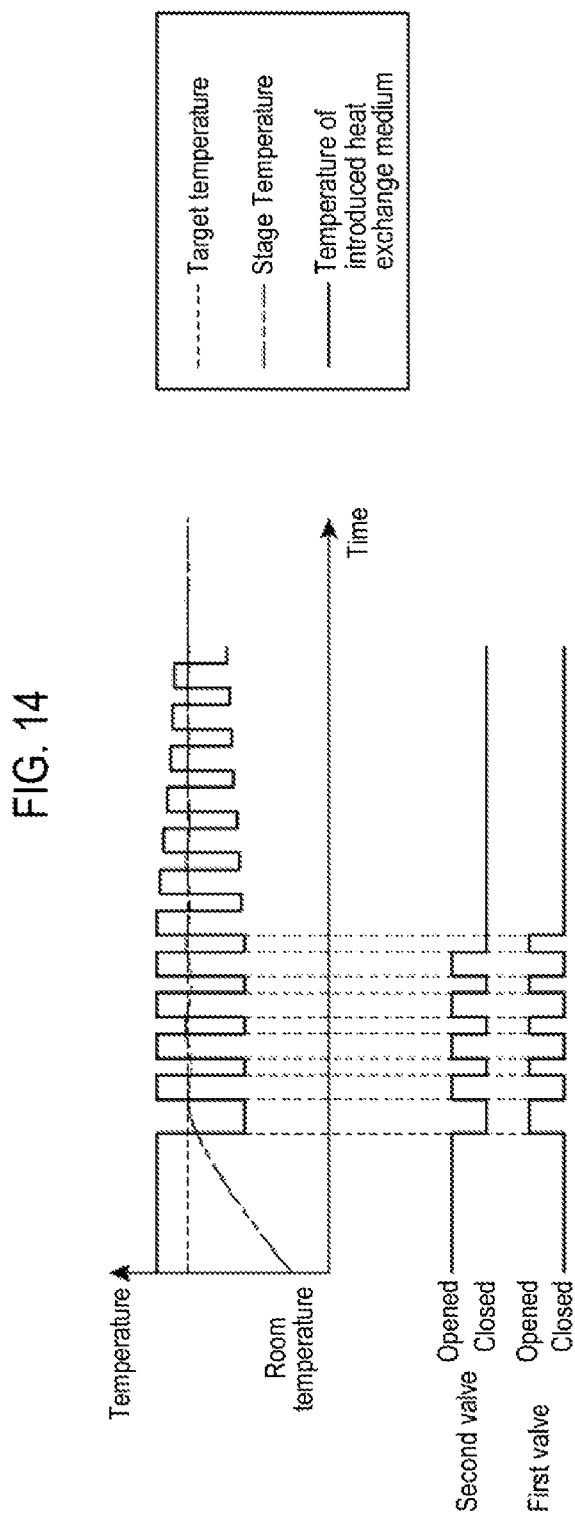
FIG. 14 is a view showing opening/closing states of a first valve and a second valve and temporal changes in temperature of a heat exchange medium supplied to heat exchange medium flow paths.

In some embodiments, if the difference between the target temperature and the temperature of the heat exchange medium measured at the temperature sensors TS is smaller than a specified threshold value, the valve control part 206 may control the opening and closing of the first valve 102, the second valve 104, the third valve 116 and the fourth valve 118 such that the heat exchange medium flowing out from the second ends of the heat exchange medium flow paths FC, i.e., the openings 24a of the second pipes 24, is re-introduced into the second opened ends 22b of the first pipes 22 through the circulation flow path. Thus, as shown in FIG. 14, the temperature of the stage can be kept substantially constant without having to supply a new heat exchange medium into the heat exchange medium flow paths FC. During a period in which the supply of the heat exchange medium to the heat exchange medium flow paths FC is stopped, it is not necessary to open and close the first valve 102, the second valve 104, the third valve 116 and the fourth valve 118. This makes it possible to prolong the lifespan of various kinds of valves. Furthermore, if the heat exchange medium is continuously circulated through the circulation flow path, it is sometimes the case that a deviation (difference) is generated between the temperature of the stage ST and the target temperature due to an energy exchange caused by the operation of a drive part installed in the circulation flow path or a heat loss in the circulation flow path. If the difference between the target temperature and the temperature adjusted by the heat exchange medium is larger than a specified threshold value, the low-temperature fluid and the high-temperature fluid are alternately supplied to the stage ST again. It is therefore possible to maintain the temperature of the stage ST at the target temperature.

In the aforementioned embodiments, there has been described the temperature control system 1 for controlling the temperature of the stage ST whose heat exchange medium flow paths are provided by the first pipes 22 of the heat exchanger 6, the partition walls 20 defining the spaces S surrounding the first pipes 22, and the second pipes 24 communicating with the spaces S. However, the stage whose temperature is controlled by the temperature control system 1 is not limited to the aforementioned stage ST. As an example, in a stage having one or more heat exchange medium flow paths formed along a circumferential direction, a temperature of the stage may be controlled by alternately supplying a low-temperature fluid and a high-temperature fluid to the heat exchange medium flow paths. In the aforementioned embodiments, the temperature of the stage ST has been described to be indirectly acquired by measuring the temperature of the heat exchange medium flowing out from the openings 24a of the second pipes 24 with the temperature sensors TS. However, the present disclosure is not limited thereto. As an example, the temperature of the stage ST may be directly measured by installing a temperature sensor configured to measure the temperature of the stage ST in the stage ST.

According to different aspects and embodiments of the present disclosure, it is possible to control a temperature of a stage with a simple configuration.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A temperature control system, comprising:
 a stage configured to support a workpiece and provided with a heat exchange medium flow path formed within the stage, the heat exchange medium flow path including a first end and a second end, a heat exchange medium flowing from the first end to the second end of the heat exchange medium flow path;
 a first valve;
 a second valve;
 a first heat exchange medium supply device including a supply port which supplies a first heat exchange medium adjusted to have a first temperature and a recovery port, the supply port being connected to the first end of the heat exchange medium flow path through the first valve;
 a second heat exchange medium supply device including a supply port which supplies a second heat exchange medium adjusted to have a second temperature higher than the first temperature and a recovery port, the supply port of the second heat exchange medium supply device connected to the first end of the heat exchange medium flow path through the second valve; and
 a controller which controls the first valve and the second valve such that the first heat exchange medium and the second heat exchange medium are alternately supplied to the first end of the heat exchange medium flow path, and stores a target temperature for the stage and a heat quantity for the stage required in achieving the target temperature in a memory,
 wherein the controller includes:
 a heat quantity acquiring controller which accesses the memory and acquires from the memory the heat quantity required in making a temperature of the stage become equal to the target temperature;
 a supply time calculating controller which calculates, based on the required heat quantity received from the heat quantity acquiring controller, supply times of the first heat exchange medium and the second heat exchange medium alternately supplied to the heat exchange medium flow path; and
 a valve controller which opens and closes the first valve and the second valve in accordance with the supply times calculated by the supply time calculating controller such that the first heat exchange medium and the second heat exchange medium are alternately supplied to the first end of the heat exchange medium flow path for the supply times calculated at the supply time calculating controller.

2. The system of claim 1, wherein the recovery port of the first heat exchange medium supply device is coupled to the second end of the heat exchange medium flow path through a third valve, and
 the recovery port of the second heat exchange medium supply device is coupled to the second end of the heat exchange medium flow path through a fourth valve.

3. The system of claim 2, further comprising:
 a temperature sensor configured to measure a temperature of the heat exchange medium flowing out from the second end of the heat exchange medium flow path.

4. The system of claim 3, further comprising:
 a circulation flow path through which the heat exchange medium flowing out from the second end of the heat exchange medium flow path is introduced into the first end of the heat exchange medium flow path,
 wherein, if a difference between the target temperature and the temperature of the heat exchange medium measured at the temperature sensor is smaller than a specified threshold value, the valve controller controls the first valve, the second valve, the third valve and the fourth valve such that the heat exchange medium flowing out from the second end of the heat exchange medium flow path is re-introduced into the first end of the heat exchange medium flow path through the circulation flow path.

5. The system of claim 3, wherein the valve controller is configured to control, based on the temperature of the heat exchange medium measured at the temperature sensor, the third valve and the fourth valve such that the first heat exchange medium supplied from the first end of the heat exchange medium flow path is introduced into the recovery port of the first heat exchange medium supply device through the second end of the heat exchange medium flow path and such that the second heat exchange medium supplied from the first end of the heat exchange medium flow path is introduced into the recovery port of the second heat exchange medium supply device through the second end of the heat exchange medium flow path.

6. The system of claim 1, wherein, prior to controlling opening and closing of the first valve and the second valve such that the first heat exchange medium and the second heat exchange medium are alternately supplied to the heat exchange medium flow path, the valve controller is configured to: control the first valve and the second valve such that one heat exchange medium of the first heat exchange medium and the second heat exchange medium for making the temperature of the stage come close to the target temperature is continuously supplied to the first end of the heat exchange medium flow path; and control the first valve and the second valve such that, after a difference between the temperature of the stage and the target temperature falls within a predetermined range by the supply of the one heat exchange medium, the other heat exchange medium of the first heat exchange medium and the second heat exchange medium is supplied to the first end of the heat exchange medium flow path.

7. A temperature control method for use in a temperature control system,
 the temperature control system including:
 a stage configured to support a workpiece and provided with a heat exchange medium flow path formed within the stage, the heat exchange medium flow path including a first end and a second end, a heat exchange medium flowing from the first end to the second end of the heat exchange medium flow path;

a first valve;

a second valve;

a first heat exchange medium supply device including a supply port which supplies a first heat exchange medium adjusted to have a first temperature and a recovery port, the supply port being connected to the first end of the heat exchange medium flow path through the first valve;

a second heat exchange medium supply device including a supply port which supplies a second heat exchange medium adjusted to have a second temperature higher than the first temperature and a recovery port, the supply port of the second heat exchange medium supply device connected to the first end of the heat exchange medium flow path through the second valve; and a controller which controls the first valve and the second valve such that the first heat exchange medium and the second heat exchange medium are alternately supplied to the first end of the heat exchange medium flow path, and stores a target temperature for the stage and a heat quantity for the stage required in achieving the target temperature in a memory, the method comprising:

accessing the memory and acquiring from the memory the heat quantity required in making a temperature of the stage become equal to the target temperature;

calculating, based on the required heat quantity, supply times of the first heat exchange medium and the second heat exchange medium alternately supplied to the heat exchange medium flow path; and controlling the first valve and the second valve to be opened and closed in accordance with the calculated supply times such that the first heat exchange medium and the second heat exchange medium are alternately supplied to the first end of the heat exchange medium flow path for the calculated supply times.

* * * * *